(12) United States Patent
Koch et al.

(10) Patent No.: US 10,355,683 B2
(45) Date of Patent: *Jul. 16, 2019

(54) CORRECTING DUTY CYCLE AND COMPENSATING FOR ACTIVE CLOCK EDGE SHIFT

(71) Applicant: International Business Machines Corporation, Armonk, NY (US)

(72) Inventors: Michael Koch, Ehningen (DE); Matthias Ringe, Tuebingen (DE); Andreas Arp, Nufringen (DE); Fatih Cilek, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,961

(22) Filed: Dec. 27, 2017

(65) Prior Publication Data

US 2019/0097618 A1    Mar. 28, 2019

Related U.S. Application Data

(63) Continuation of application No. 15/714,012, filed on Sep. 25, 2017.

(51) Int. Cl.
*H03K 3/017* (2006.01)
*H03K 5/156* (2006.01)
(Continued)

(52) U.S. Cl.
CPC ........... *H03K 5/1565* (2013.01); *H03K 5/133* (2013.01); *H03K 21/08* (2013.01); *H03K 2005/00065* (2013.01); *H03K 2005/00071* (2013.01)

(58) Field of Classification Search
None
See application file for complete search history.

(56) References Cited

U.S. PATENT DOCUMENTS 7,705,647 B2    4/2010   Dai et al.
7,839,194 B2    11/2010  Chang et al.
(Continued)

OTHER PUBLICATIONS

Boghrati, et al., "A 800 MHz-1.1 GHz 1.2 mW Delay Locked Loop with a Closed Loop Duty Cycle Corrector," Journal of Electrical and Electronic Systems, vol. 5, Issue 2, 2016, 3 pages, DOI. 10.4172/2332-0796.1000179.

(Continued)

*Primary Examiner* — Cassandra F Cox
(74) *Attorney, Agent, or Firm* — Jared C. Chaney

(57) ABSTRACT

The present invention provides a system and method of correcting duty cycle (DC) and compensating for active clock edge shift. In an embodiment, the system includes at least one control circuit to receive DCC control signals and to output at least one first adjustment signal, at least one second adjustment signal, at least one first correction signal, and at least one second correction signal, at least one adjustment circuit to change a DC value of an input clock signal, at least one correction circuit to compensate for a shift of an active clock edge of the input clock signal, and where one of the at least one adjustment circuit and the at least one correction circuit is to receive the input clock signal and wherein one of the at least one adjustment circuit and the at least one correction circuit is to transmit a corrected output clock signal.

4 Claims, 27 Drawing Sheets

(51) Int. Cl.
*H03K 5/133* (2014.01)
*H03K 21/08* (2006.01)
*H03K 5/00* (2006.01)

(56) References Cited

U.S. PATENT DOCUMENTS

| | | | |
|---|---|---|---|
| 7,990,194 | B2 | 8/2011 | Shim |
| 8,018,261 | B2 | 9/2011 | Becker et al. |
| 8,513,997 | B2 | 8/2013 | Hesen et al. |
| 8,570,084 | B2 | 10/2013 | Lin |
| 8,803,576 | B2 | 8/2014 | Kitagawa |
| 9,048,823 | B2 | 6/2015 | Bui et al. |
| 9,413,347 | B1 | 8/2016 | Nien |
| 9,520,867 | B2 | 12/2016 | Lin |
| 10,063,222 | B1 | 8/2018 | Arp et al. |
| 2002/0070752 | A1* | 6/2002 | Harrison ............... G06F 1/08 326/29 |
| 2002/0196883 | A1 | 12/2002 | Best et al. |
| 2008/0191767 | A1 | 8/2008 | Koo |
| 2008/0272815 | A1 | 11/2008 | Yeo et al. |
| 2010/0225372 | A1* | 9/2010 | Satoh ............... H03K 5/1565 327/175 |
| 2011/0248752 | A1* | 10/2011 | Willey ............... H03K 5/1565 327/117 |
| 2012/0019299 | A1 | 1/2012 | McLeod et al. |
| 2012/0223754 | A1 | 9/2012 | Lewis |
| 2013/0063191 | A1 | 3/2013 | Patil et al. |
| 2013/0154702 | A1 | 6/2013 | Kim et al. |
| 2014/0009197 | A1* | 1/2014 | Yasuda ............... H03K 3/017 327/175 |
| 2014/0333361 | A1* | 11/2014 | Chau ............... H03K 3/017 327/175 |
| 2015/0002201 | A1* | 1/2015 | Kitagawa ............ H03K 5/1565 327/175 |
| 2015/0171834 | A1* | 6/2015 | Arp ................. H03K 5/1565 327/175 |
| 2015/0200655 | A1 | 7/2015 | Kang et al. |
| 2015/0341021 | A1* | 11/2015 | Ma ..................... H03K 3/017 327/175 |
| 2015/0364176 | A1 | 12/2015 | Lee |
| 2016/0013785 | A1* | 1/2016 | Nakata ............... H03K 5/1565 327/175 |
| 2016/0094205 | A1 | 3/2016 | Aremallapur |
| 2017/0033746 | A1 | 2/2017 | Lam et al. |
| 2017/0040986 | A1 | 2/2017 | Ma |
| 2017/0093386 | A1 | 3/2017 | Kitagawa |
| 2017/0111033 | A1 | 4/2017 | Chae et al. |

OTHER PUBLICATIONS

Arp et al., "Dynamic Control of Edge Shift for Duty Cycle Correction", U.S. Appl. No. 15/714,438, filed Sep. 25, 2017.

Arp et al., "Static Compensation of an Active Clock Edge Shift for a Duty Cycle Correction Circuit," U.S. Appl. No. 15/713,738, filed Sep. 25, 2017.

Chung et al., "A wide-range all-digital duty-cycle corrector with output clock phase alignment in 65 nm CMOS technology," Device Electronics Express, vol. 8, No. 15, 2011, 7 pages.

Nam, "An All-Digital CMOS Duty Cycle Correction Circuit with a Duty-Cycle Correction Range of 15-to-85% for Multi-Phase Applications", IEICE Transactions on Electronics, vol. E88-C, No. 4 Apr. 2005, pp. 773-777.

Wang, et al. "A Compact Delay-Recycled Clock Skew-Compensation and/or Duty-Cycle-Correction Circuit", SOC Conference (SOCC) 2011 IEEE International, Sep. 26-28, 2011, 9 Pages.

Koch et al., "Correcting Duty Cycle3 and Compensating for Active Clock Edge Shift," U.S. Appl. No. 15/714,012, filed Sep. 25, 2017.

Arp et al., "Static Compensation of an Active Clock Edge Shift for a Duty Cycle Correction Circuit," U.S. Appl. No. 15/855,039, filed Dec. 27, 2017.

Arp et al., "Dynamic Control of Edge Shift for Duty Cycle Correction", U.S. Appl. No. 15/854,985, filed Dec. 27, 2017.

* cited by examiner

ACTIVE CLOCK EDGE

CORRECTING DUTY CYCLE AND COMPENSATING FOR ACTIVE CLOCK EDGE SHIFT

BACKGROUND

The present disclosure relates to electronic circuits, and more specifically, to correcting duty cycle and compensating for active clock edge shift for electronic circuits.

SUMMARY

The present invention provides a system and method of correcting duty cycle and compensating for active clock edge shift for electronic circuits. In an exemplary embodiment, the system includes (1) at least one control circuit logically configured to receive duty cycle correction (DCC) control signals and logically configured to output at least one first adjustment signal, at least one second adjustment signal, at least one first correction signal, and at least one second correction signal, (2) at least one adjustment circuit logically coupled to the at least one control circuit and logically configured to change a duty cycle value of an input clock signal in response to receiving the at least one first adjustment signal on a first adjustment input of the at least one adjustment circuit and the at least one second adjustment signal on a second adjustment input of the at least one adjustment circuit, (3) at least one correction circuit logically coupled to the at least one control circuit, logically coupled to the at least one adjustment circuit, and logically configured to compensate for a shift of an active clock edge of the input clock signal in response to receiving the at least one first correction signal on a first correction input of the at least one correction circuit and the at least one second correction signal on a second correction input of the at least one correction circuit, (4) where one of a set of the at least one adjustment circuit and the at least one correction circuit is logically configured to receive the input clock signal, and (5) where one of the set of the at least one adjustment circuit and the at least one correction circuit is logically configured to transmit a corrected output clock signal, in response to the at least one adjustment circuit receiving the at least one first adjustment signal and the at least one second adjustment signal and in response to the at least one correction circuit receiving the at least one first correction signal and the at least one second correction signal.

In an exemplary embodiment, the method includes (1) receiving an input clock signal by one of a set of at least one adjustment circuit and at least one correction circuit, where the at least one correction circuit is logically coupled to the at least one adjustment circuit, (2) in response to receiving duty cycle correction control signals by at least one control circuit logically coupled to the at least one adjustment circuit and logically coupled to the at least one correction circuit, outputting at least one first adjustment signal, at least one second adjustment signal, at least one first correction signal, and at least one second correction signal, by the at least one control circuit, (3) in response to the at least one adjustment circuit receiving the at least one first adjustment signal on a first adjustment input of the at least one adjustment circuit and the at least one second adjustment signal on a second adjustment input of the at least one adjustment circuit, changing by the at least one adjustment circuit a duty cycle value of the input clock signal, (4) in response to the at least one correction circuit receiving the at least one first correction signal on a first correction input of the at least one correction circuit and the at least one second correction signal on a second correction input of the at least one correction circuit, compensating by the at least one correction circuit for a shift of an active clock edge of the input clock signal, and (5) in response to the at least one adjustment circuit receiving the at least one first adjustment signal and the at least one second adjustment signal and in response to the at least one correction circuit receiving the at least one first correction signal and the at least one second correction signal, transmitting a corrected output clock signal by one of the set of the at least one adjustment circuit and the at least one correction circuit.

In an alternative embodiment, the system includes (1) at least one control circuit logically configured to receive duty cycle correction control signals and logically configured to output at least one first even adjustment signal, at least one second even adjustment signal, at least one first even correction signal, at least one second even correction signal, at least one first odd adjustment signal, at least one second odd adjustment signal, at least one first odd correction signal, and at least one odd even correction signal, (2) at least one even adjustment and correction circuit logically coupled to the at least one control circuit and logically configured to change a duty cycle value of an input clock signal in response to receiving the at least one first even adjustment signal on a first even adjustment input, the at least one second even adjustment signal on a second even adjustment input, the at least one first even correction signal on a first even correction input, and the at least one second even correction signal on a second even correction input, (3) at least one odd adjustment and correction circuit logically coupled to the at least one control circuit, logically coupled to the at least one even adjustment and correction circuit, and logically configured to compensate for a shift of an active clock edge of the input clock signal in response to receiving the at least one first odd adjustment signal on a first odd adjustment input, the at least one second odd adjustment signal on a second odd adjustment input, the at least one first odd correction signal on a first odd correction input, and the at least one second odd correction signal on a second odd correction input, (4) where one of a set of the at least one even adjustment and correction circuit and the at least one odd adjustment and correction circuit is logically configured to receive the input clock signal, and (5) where one of the set of the at least one even adjustment and correction circuit and the at least one odd adjustment and correction circuit is logically configured to transmit a corrected output clock signal, in response to the at least one even adjustment and correction circuit receiving the at least one first even adjustment signal, the at least one second even adjustment signal, the at least one first even correction signal, and the at least one second even correction signal and in response to the at least one odd adjustment and correction circuit receiving the at least one first odd adjustment signal, the at least one second odd adjustment signal, the at least one first odd correction signal, and the at least one second odd correction signal.

DETAILED DESCRIPTION

Figure 1A:
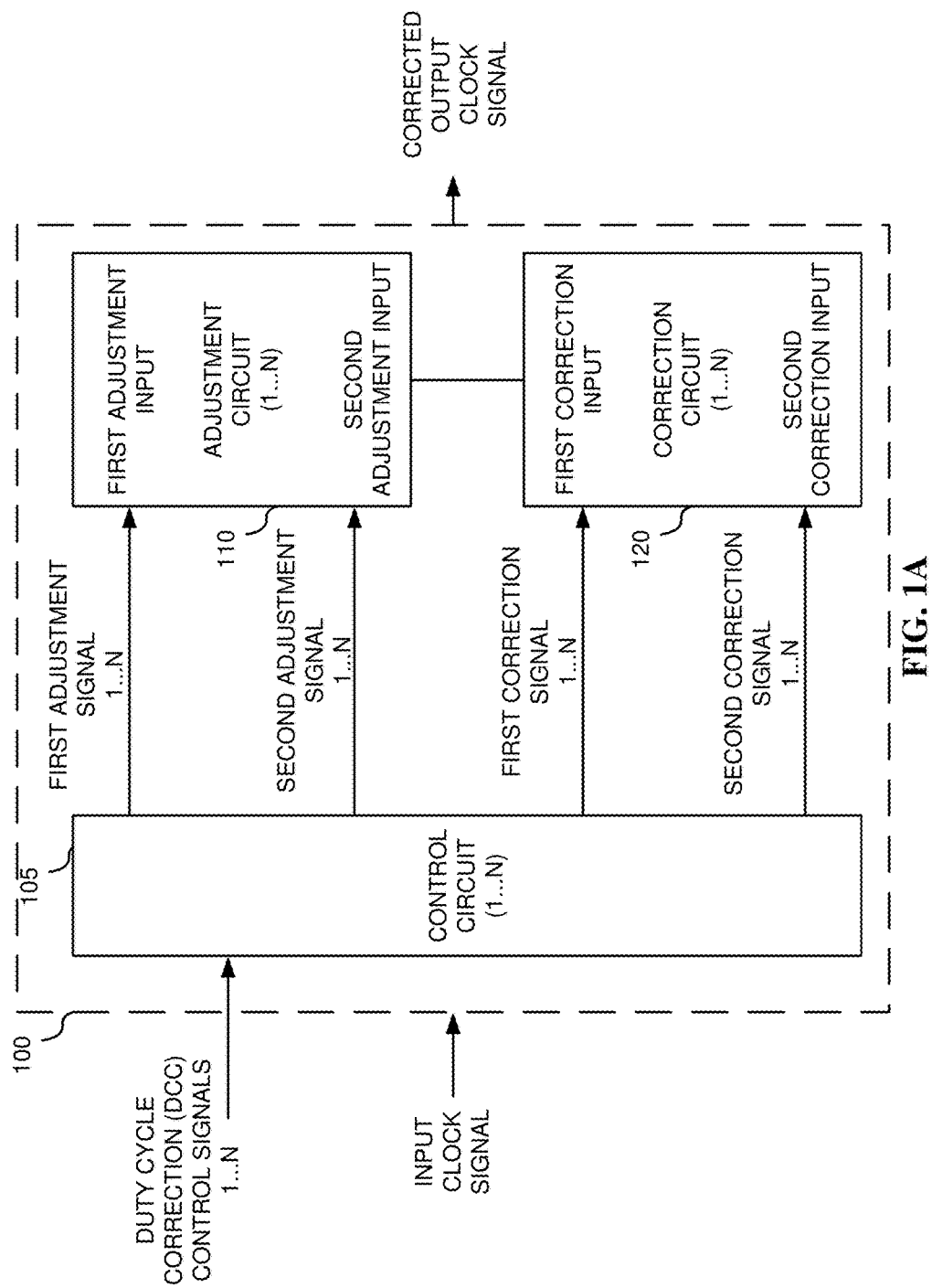
FIG. 1A depicts a block diagram in accordance with an exemplary embodiment of the present invention.

The present invention provides a system and method of correcting duty cycle and compensating for active clock edge shift for electronic circuits. In an exemplary embodiment, the system includes (1) at least one control circuit logically configured to receive duty cycle correction (DCC) control signals and logically configured to output at least one first adjustment signal, at least one second adjustment signal, at least one first correction signal, and at least one second correction signal, (2) at least one adjustment circuit logically coupled to the at least one control circuit and logically configured to change a duty cycle value of an input clock signal in response to receiving the at least one first adjustment signal on a first adjustment input of the at least one adjustment circuit and the at least one second adjustment signal on a second adjustment input of the at least one adjustment circuit, (3) at least one correction circuit logically coupled to the at least one control circuit, logically coupled to the at least one adjustment circuit, and logically configured to compensate for a shift of an active clock edge of the input clock signal in response to receiving the at least one first correction signal on a first correction input of the at least one correction circuit and the at least one second correction signal on a second correction input of the at least one correction circuit, (4) where one of a set of the at least one adjustment circuit and the at least one correction circuit is logically configured to receive the input clock signal, and (5) where one of the set of the at least one adjustment circuit and the at least one correction circuit is logically configured to transmit a corrected output clock signal, in response to the at least one adjustment circuit receiving the at least one first adjustment signal and the at least one second adjustment signal and in response to the at least one correction circuit receiving the at least one first correction signal and the at least one second correction signal. In an embodiment, the active clock edge of the input clock signal is a rising edge of the input clock signal. In an embodiment, the active clock edge of the input clock signal is a falling edge of the input clock signal.

In an exemplary embodiment, the method includes (1) receiving an input clock signal by one of a set of at least one adjustment circuit and at least one correction circuit, where the at least one correction circuit is logically coupled to the at least one adjustment circuit, (2) in response to receiving duty cycle correction control signals by at least one control circuit logically coupled to the at least one adjustment circuit and logically coupled to the at least one correction circuit, outputting at least one first adjustment signal, at least one second adjustment signal, at least one first correction signal, and at least one second correction signal, by the at least one control circuit, (3) in response to the at least one adjustment circuit receiving the at least one first adjustment signal on a first adjustment input of the at least one adjustment circuit and the at least one second adjustment signal on a second adjustment input of the at least one adjustment circuit, changing by the at least one adjustment circuit a duty cycle value of the input clock signal, (4) in response to the at least one correction circuit receiving the at least one first correction signal on a first correction input of the at least one correction circuit and the at least one second correction signal on a second correction input of the at least one correction circuit, compensating by the at least one correction circuit for a shift of an active clock edge of the input clock signal, and (5) in response to the at least one adjustment circuit receiving the at least one first adjustment signal and the at least one second adjustment signal and in response to the at least one correction circuit receiving the at least one first correction signal and the at least one second correction signal, transmitting a corrected output clock signal by one of the set of the at least one adjustment circuit and the at least one correction circuit. In a further embodiment, the method further includes in response to receiving a duty cycle control value of zero as delivered by the duty cycle correction control signals via the at least one control circuit, adding, by the at least one correction circuit, a correction delay to the active clock edge of the input clock signal and to an inactive clock edge of the input clock signal. In a further embodiment, the method further includes in response to receiving a positive duty cycle control value as delivered by the duty cycle correction control signals via the at least one control circuit, adding, by the at least one adjustment circuit, an adjustment delay to an inactive clock edge of the input clock signal, and adding, by the at least one correction circuit, a correction delay to the active clock edge of the input clock signal and to the inactive clock edge of the input clock signal. In a further embodiment, the method further includes in response to receiving a negative duty cycle control value as delivered by the duty cycle correction control signals via the at least one control circuit, adding, by the at least one adjustment circuit, an adjustment delay to the active clock edge of the input clock signal.

As an example, the additional delays may not completely be removed if the DCC control value changes from zero to a small positive or negative value. In an embodiment, the delays are adapted to reach the target of having a constant delay of the active clock edge no matter what value the DCC control value.

In an alternative embodiment, the system includes (1) at least one control circuit logically configured to receive duty cycle correction control signals and logically configured to output at least one first even adjustment signal, at least one second even adjustment signal, at least one first even correction signal, at least one second even correction signal, at least one first odd adjustment signal, at least one second odd adjustment signal, at least one first odd correction signal, and at least one odd even correction signal, (2) at least one even adjustment and correction circuit logically coupled to the at least one control circuit and logically configured to change a duty cycle value of an input clock signal in response to receiving the at least one first even adjustment signal on a first even adjustment input, the at least one second even adjustment signal on a second even adjustment input, the at least one first even correction signal on a first even correction input, and the at least one second even correction signal on a second even correction input, (3) at least one odd adjustment and correction circuit logically coupled to the at least one control circuit, logically coupled to the at least one even adjustment and correction circuit, and logically configured to compensate for a shift of an active clock edge of the input clock signal in response to receiving the at least one first odd adjustment signal on a first odd adjustment input, the at least one second odd adjustment signal on a second odd adjustment input, the at least one first odd correction signal on a first odd correction input, and the at least one second odd correction signal on a second odd correction input, (4) where one of a set of the at least one even adjustment and correction circuit and the at least one odd adjustment and correction circuit is logically configured to receive the input clock signal, and (5) where one of the set of the at least one even adjustment and correction circuit and the at least one odd adjustment and correction circuit is logically configured to transmit a corrected output clock signal, in response to the at least one even adjustment and correction circuit receiving the at least one first even adjustment signal, the at least one second even adjustment signal, the at least one first even correction signal, and the at least one second even correction signal and in response to the at least one odd adjustment and correction circuit receiving the at least one first odd adjustment signal, the at least one second odd adjustment signal, the at least one first odd correction signal, and the at least one second odd correction signal. In an embodiment, the active clock edge of the input clock signal is a rising edge of the input clock signal. In an embodiment, the active clock edge of the input clock signal is a falling edge of the input clock signal.

In alternative embodiment, the system includes an adjustment circuit logically coupled to a correction circuit, where the adjustment circuit is logically configured to change a duty cycle value of an input clock signal and where the correction circuit is logically configured to compensate for a shift of an active clock edge of the input clock signal, in response to receiving adjustment signals and correction signals. In a further embodiment, the system further includes control circuitry logically coupled to the adjustment circuit, logically coupled to the correction circuits, and logically configured to convert duty cycle correction control signals into the adjustment signals and the correction signals.

Definitions

Clock Signals and Clock Circuits

A clock signal is a particular type of signal that oscillates between a high and a low state and is utilized like a metronome to coordinate actions of digital circuits, where the clock signal is produced by a clock generator/clock circuit. Although more complex arrangements are used, the most common clock signal is in the form of a square wave with a 50% duty cycle, usually with a fixed, constant frequency. Electronic circuits using a clock signal for synchronization may become active at either the rising edge, falling edge, or, in the case of double data rate, both in the rising and in the falling edges of the clock cycle. Most integrated circuits (ICs) of sufficient complexity use a clock signal in order to synchronize different parts of the circuit, cycling at a rate slower than the worst-case internal propagation delays. For example, electronic circuits typically use clock signals to trigger data takeover into storage elements. As ICs become more complex (e.g., microprocessors), the problem of supplying accurate and synchronized clocks to all the circuits becomes increasingly difficult.

Clock signals have some very special characteristics and attributes. Clock signals are typically loaded with the greatest fanout and operate at the highest speeds of any signal within the synchronous system. Since the data signals are provided with a temporal reference by the clock signals, the clock waveforms must be particularly clean and sharp. Furthermore, these clock signals are particularly affected by technology scaling, in that long global interconnect lines become significantly more resistive as line dimensions are decreased such that such increased line resistance is one of the primary reasons for the increasing significance of clock distribution on synchronous performance. Finally, the control of any differences and uncertainty in the arrival times of the clock signals could severely limit the maximum performance of the entire system and could create catastrophic race conditions in which an incorrect data signal may latch within a register.

Duty Cycle

Duty cycle, if provided as a percent value, is the percentage of the ratio of pulse duration, or pulse width (PW) to the total period (T) of a waveform and is generally used to represent the time duration of a pulse when it is high (digital/logic 1). Duty cycle, when provided as a relation, is the relation of the period of time that a clock signal is high over the period of time that the clock signal is low. In digital electronics, signals are used in rectangular waveform which are represented by logic 1 and logic 0. For example, a signal (10101010) has 50% duty cycle, because the pulse remains high for ½ of the period or low for ½ of the period. Similarly, for pulse (10001000) the duty cycle will be 25% because the pulse remains high only for ¼ of the period and remains low for ¾ of the period.

Duty Cycle Correction

Duty cycle correction can be used to avoid detection error in analog front end circuits in digital systems. Voltage levels are detected by an alternating current (AC) coupled circuit or a direct current (DC) coupled circuit with reference level. If the duty cycle of an input signal for a voltage level detector is not proper, the detector could output an incorrect logical signal (e.g., for an input of 010001, the detector outputs 00001. Duty cycle correction can also be used application for circuits which are sensitive to both clock edges (like register arrays), where such circuits need to have roughly the same amount of time for operation between the clock edges.

A duty cycle correction circuit (DCC) circuit impacts the duty cycle of an input clock signal (clkin) in response to receiving a DCC control input signal, resulting in an output clock signal (clkout) with a corrected duty cycle. A negative DCC control signal should lead to a reduced duty cycle with respect to the duty cycle of the input clock signal, while a positive DCC control signal should lead to an increased duty cycle with respect to the duty cycle of the input clock signal. In an ideal case, the DCC correction circuit should only move the inactive edge of the input clock signal.

A DCC control signal of zero to a DCC circuit could allow the input clock signal to traverse the DCC circuit in minimal time with minimal distortion of the duty cycle, but could also cause additional delay, or could lead to the clock signal traveling through the DCC circuit faster. A negative DCC control signal to a DCC circuit should reduce the duty cycle of the input clock signal by delaying the active edge of the input clock signal. A positive DCC control signal to a DCC circuit should increase the duty cycle of the input clock signal by delaying the inactive edge of the input clock signal.

Inverters/Inverter Circuits

An inverter/inverter circuit/NOT gate is a logic gate which implements logical negation. An inverter circuit outputs a voltage representing the opposite logic-level to its input where its main function being to invert the input signal applied such that if the applied input is low then the output becomes high and vice versa. Inverters can be constructed using a single N-type metal-oxide-semiconductor (NMOS) transistor or a single P-type metal-oxide-semiconductor (PMOS) (p-MOS) transistor coupled with a resistor such that since this "resistive-drain" approach uses only a single type of transistor, it can be fabricated at low cost. However, because current flows through the resistor in one of the two states, the resistive-drain configuration is disadvantaged for power consumption and processing speed. Alternatively, inverters can be constructed using two complementary transistors in a CMOS configuration where this configuration greatly reduces power consumption since one of the transistors is always off in both logic states and where processing speed can also be improved due to the relatively low resistance compared to the NMOS-only or PMOS-only type devices. Inverters can also be constructed with bipolar junction transistors (BJT) in either a resistor-transistor logic (RTL) or a transistor-transistor logic (TTL) configuration. Digital electronics circuits operate at voltage levels corresponding to a logical 0 or 1, such that an inverter circuit serves as the basic logic gate to swap between those two voltage levels, where implementation determines the actual voltage, but common levels include (0, +5V) for TTL circuits.

Problems with Duty Cycle Correction Circuits

A duty cycle correction circuit (DCC) introduces the inherent delay of the DCC into an input clock signal for which the DCC is attempting correct the duty cycle of the input clock signal, thereby moving the active edge of the input clock signal, at least by an amount of time equal to the inherent delay of the DCC.

System

Referring to FIG. 1A, in an exemplary embodiment, the present invention provides a system 100 of correcting duty cycle and compensating for active clock edge shift for electronic circuits. In an exemplary embodiment, system 100 includes (1) at least one control circuit (1 . . . N) 105 logically configured to receive duty cycle correction (DCC) control signals 1 . . . N and logically configured to output at least one first adjustment signal 1 . . . N, at least one second adjustment signal 1 . . . N, at least one first correction signal 1 . . . N, and at least one second correction signal 1 . . . N, (2) at least one adjustment circuit (1 . . . N) 110 logically coupled to at least one control circuit (1 . . . N) 105 and logically configured to change a duty cycle value of an input clock signal in response to receiving the at least one first adjustment signal 1 . . . N on a first adjustment input of at least one adjustment circuit 110 and the at least one second adjustment signal 1 . . . N on a second adjustment input of at least one adjustment circuit 110, (3) at least one correction circuit (1 . . . N) 120 logically coupled to at least one control circuit (1 . . . N) 105, logically coupled to at least one adjustment circuit (1 . . . N) 110, and logically configured to compensate for a shift of an active clock edge of the input clock signal in response to receiving the at least one first correction signal 1 . . . N on a first correction input of at least one correction circuit 120 and the at least one second correction signal 1 . . . N on a second correction input of at least one correction circuit 120, (4) where one of a set of at least one adjustment circuit (1 . . . N) 110 and at least one correction circuit (1 . . . N) 120 is logically configured to receive the input clock signal, and (5) where one of the set of at least one adjustment circuit (1 . . . N) 110 and at least one correction circuit (1 . . . N) 120 is logically configured to transmit a corrected output clock signal, in response to at least one adjustment circuit (1 . . . N) 110 receiving the at least one first adjustment signal 1 . . . N and the at least one second adjustment signal 1 . . . N and in response to at least one correction circuit (1 . . . N) 120 receiving the at least one first correction signal 1 . . . N and the at least one second correction signal 1 . . . N.

In an embodiment, logical couplings include electrical connections, optical connections, wireless connections, and electro-magnetic connections. In addition, the present invention is not limited to the number of components depicted in the Figures. In an embodiment, system 100 includes N adjustment circuits, where N is a positive integer. In an embodiment, system 100 includes N correction circuits, where N is a positive integer. In an embodiment, system 100 includes N adjustment circuits and N correction circuits, where N is a positive integer.

In an embodiment, the present invention extends the shift of the active clock edge by introducing an adjustable delay to compensate for such shift, such that the shift is constant over all DCC control signal values. In an embodiment, the present invention introduces a delay into a DCC and reduces such delay in case the active edge of the input clock signal is shifted. For example, the present invention could use at least one correction circuit to compensate for the shift of the active clock edge. In an embodiment, each correction circuit is switched on or off in response to DCC control signal values. As an example, the present invention could be used for an even number of adjustment circuit and an even number of correction circuits. In an embodiment, different branches of the adjustment circuits and the correction circuits are turned on and off in response to DCC control signal values.

In an embodiment, the present invention compensates for the different delays of the active edge caused by an adjust/adjustment stage (e.g., adjustment circuits), by adding another programmable delay via a correction stage (e.g., correction circuits) after the adjust stage. For example, if the delay of the adjust stage were large, the correction stage could produce a small programmable delay. Also, for example, if the delay of the adjust stage were small, the correction stage could produce a large programmable delay.

The present invention operates to maintain the sum of the delay of the adjustment/adjust stage/circuit and the programmable delay of the correction stage/circuit constant, as shown by Equations 1A 1B, 1C, and 1D. Equations 1A 1B, 1C, and 1D would hold true for a configuration where the adjustment stage is in front of the correction stage, e.g.:

input clock signal || adjustment stage || clk 2 || correction stage || output clock signal.

$$\Delta t_{in,out,0} = \Delta t_{in,out,min} = \Delta t_{in,out,max} \quad \text{Equation 1A}$$

Equation 1A means that the delay of the active edge from the input clock signal clkin to the output clock signal clkout of the new device would be the same for a DCC control value of 0, min and max.

$$\Delta t_{in,2,0} = \Delta t_{in,2,max} < \Delta t_{in,2,min} \quad \text{Equation 1B}$$

Equation 1B means that the delay of the active edge from the input clock signal clkin to clock signal clk2 of the new device for DCC control value of zero would be equal to the delay of the active edge from the input clock signal clkin to clock signal clk2 for a maximum DCC control value, where such delay would be smaller than the delay of the active edge from the input clock signal clkin to the clock signal clk2 for a minimum.

$$\Delta t_{2,out,0} = \Delta t_{2,out,max} > \Delta t_{2,out,min} \quad \text{Equation 1C}$$

Equation 1C means that the delay of the active edge from the clock signal clk2 to the output clock signal clkout of the new device for dcc control value of zero would be equal to the delay of the active edge from the clock signal clk2 to the output clock signal clkout for a maximum DCC control value, where such delay would be greater than the delay of the active edge from the clock signal clk2 to the output clock signal clkout for a minimum DCC control value.

$$\Delta t_{in,out,*} = \Delta t_{in,2,*} + \Delta t_{2,out,*} = const. \quad \text{Equation 1D}$$

Equation 1D means that the delay of the active edge from the input clock signal clkin to the output clock signal clkout of the new device would be the sum of the delay from the input clock signal clkin to clock signal clk2 and the delay from the clock signal clk2 to the output clock signal clkout, where such delay would be constant for all DCC control values.

In $\Delta t_{index1,index2,index3}$, the indices have the following meanings (i) index1 denotes the input signal (e.g., in for input clock, 2 for clk2), (ii) index 2 denotes the output signal (e.g. 2 for clk2, out for output clock), and (iii) index 3 denotes the dc control value min for minimum, 0 for 0, max for maximum.

Method

Figure 1B:
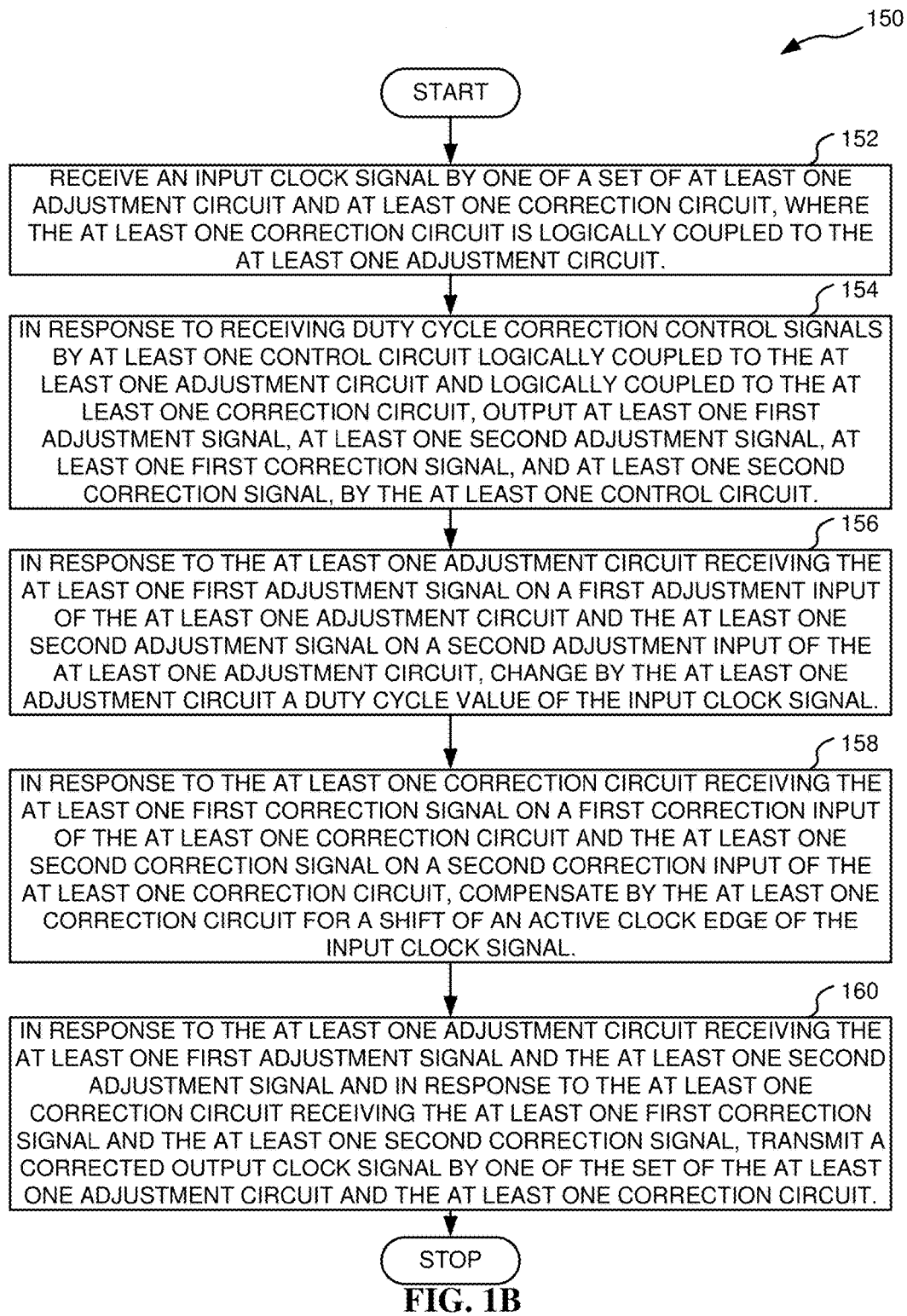
FIG. 1B depicts a flowchart in accordance with an exemplary embodiment of the present invention.

Referring to FIG. 1B, in an exemplary embodiment, the present invention provides a method 150 of correcting duty cycle and compensating for active clock edge shift for electronic circuits. In an exemplary embodiment, method 150 includes (1) an operation 152 of receiving an input clock signal by one of a set of at least one adjustment circuit and at least one correction circuit, where the at least one correction circuit is logically coupled to the at least one adjustment circuit, (2) an operation 154 of in response to receiving duty cycle correction control signals by at least one control circuit logically coupled to the at least one adjustment circuit and logically coupled to the at least one correction circuit, outputting at least one first adjustment signal, at least one second adjustment signal, at least one first correction signal, and at least one second correction signal, by the at least one control circuit, (3) an operation 156 of in response to the at least one adjustment circuit receiving the at least one first adjustment signal on a first adjustment input of the at least one adjustment circuit and the at least one second adjustment signal on a second adjustment input of the at least one adjustment circuit, changing by the at least one adjustment circuit a duty cycle value of the input clock signal, (4) an operation 158 of in response to the at least one correction circuit receiving the at least one first correction signal on a first correction input of the at least one correction circuit and the at least one second correction signal on a second correction input of the at least one correction circuit, compensating by the at least one correction circuit for a shift of an active clock edge of the input clock signal, and (5) an operation 160 of in response to the at least one adjustment circuit receiving the at least one first adjustment signal and the at least one second adjustment signal and in response to the at least one correction circuit receiving the at least one first correction signal and the at least one second correction signal, transmitting a corrected output clock signal by one of the set of the at least one adjustment circuit and the at least one correction circuit.

In a further embodiment, method 150 further includes in response to receiving a duty cycle control value of zero as delivered by the duty cycle correction control signals via the at least one control circuit, adding, by the at least one correction circuit, a correction delay to the active clock edge of the input clock signal and to an inactive clock edge of the input clock signal. In a further embodiment, method 150 further includes in response to receiving a positive duty cycle control value as delivered by the duty cycle correction control signals via the at least one control circuit, adding, by the at least one adjustment circuit, an adjustment delay to an inactive clock edge of the input clock signal, and adding, by the at least one correction circuit, a correction delay to the active clock edge of the input clock signal and to the inactive clock edge of the input clock signal. In a further embodiment, method 150 further includes in response to receiving a negative duty cycle control value as delivered by the duty cycle correction control signals via the at least one control circuit, adding, by the at least one adjustment circuit, an adjustment delay to the active clock edge of the input clock signal.

In an embodiment, one of a set of at least one adjustment circuit (1 . . . N) 110 and at least one correction circuit (1 . . . N) 120 performs operation 152 of receiving the input clock signal. In an embodiment, at least one control circuit (1 . . . N) 105 performs operation 154 of outputting the at least one first adjustment signal 1 . . . N, the at least one second adjustment signal 1 . . . N, the at least one first correction signal 1 . . . N, and the at least one second correction signal 1 . . . N, in response to receiving the duty cycle correction (DCC) control signals 1 . . . N. In an embodiment, at least one adjustment circuit (1 . . . N) 110 performs operation 156 of changing a duty cycle value of the input clock signal, in response to at least one adjustment circuit (1 . . . N) 110 receiving the at least one first adjustment signal 1 . . . N on the first adjustment input of at least one adjustment circuit (1 . . . N) 110 and the at least one second adjustment signal 1 . . . N on the second adjustment input of at least one adjustment circuit (1 . . . N) 110. In an embodiment, at least one correction circuit (1 . . . N) 120 performs operation 158 of compensating for a shift of an active clock edge of the input clock signal, in response to at least one correction circuit (1 . . . N) 120 receiving the at least one first correction signal 1 . . . N on the first correction input of at least one correction circuit (1 . . . N) 120 and the at least one second correction signal 1 . . . N on the second correction input of at least one correction circuit (1 . . . N) 120. In an embodiment, one of the set of at least one adjustment circuit (1 . . . N) 110 and at least one correction circuit (1 . . . N) 120 performs operation 160 of transmitting the corrected output clock signal, in response to at least one adjustment circuit (1 . . . N) 110 receiving the at least one first adjustment signal 1 . . . N and the at least one second adjustment signal 1 . . . N and in response to the at least one correction circuit (1 . . . N) 120 receiving the at least one first correction signal 1 . . . N and the at least one second correction signal 1 . . . N.

Adjustment and Correction Circuits

Adjustment Circuit

In an exemplary embodiment, the at least one adjustment circuit includes (a) an adjustment clock input, an adjustment voltage supply input, the first adjustment input, the second adjustment input, an adjustment ground input, and an adjustment clock output, (b) an adjustment inverter circuit logically coupled to the adjustment clock input and logically coupled to the adjustment clock output, (c) an adjustment p-type transistor logically coupled to the first adjustment input, logically coupled to the adjustment inverter circuit, and logically coupled to the adjustment clock output, (d) a first pull-up p-type transistor logically coupled to the adjustment clock input, electrically coupled to the adjustment voltage supply input, and logically coupled to the adjustment p-type transistor, (e) an adjustment n-type transistor logically coupled to the second adjustment input, logically coupled to the adjustment inverter circuit, logically coupled to the adjustment p-type transistor, and logically coupled to the adjustment clock output, and (f) a first pull-down n-type transistor logically coupled to the adjustment clock input, electrically coupled to the adjustment ground input, and logically coupled to the adjustment n-type transistor.

Figure 2A:
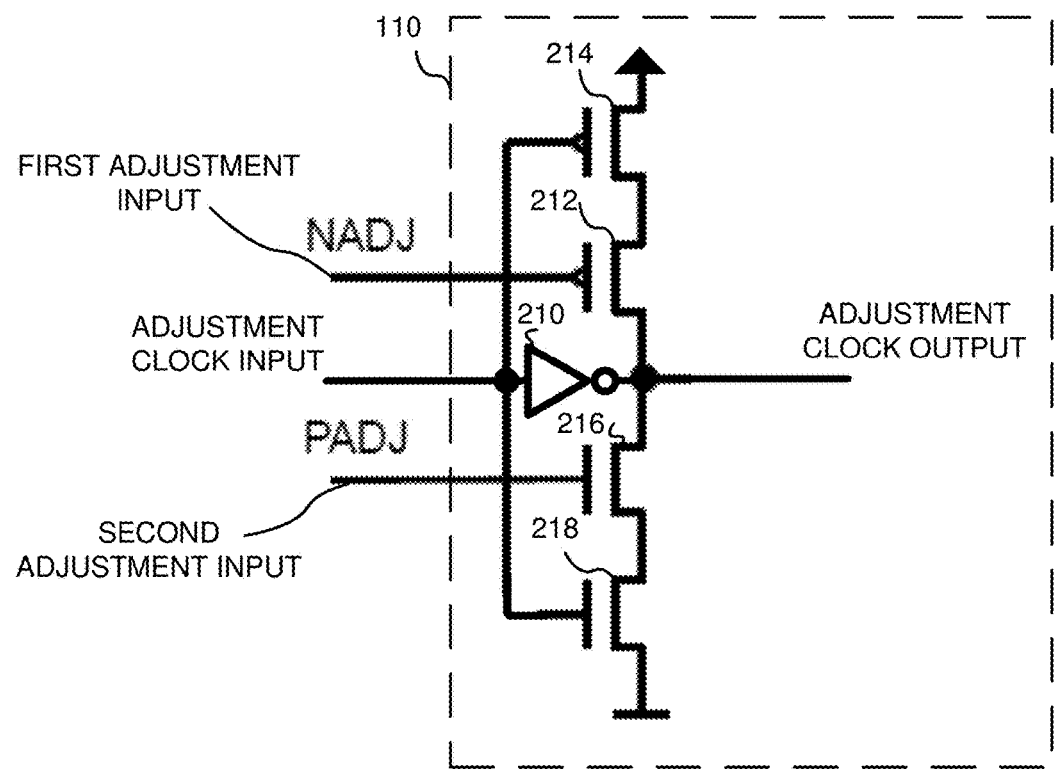
FIG. 2A depicts a circuit diagram in accordance with an embodiment of the present invention.

Referring to FIG. 2A, in an exemplary embodiment, the at least one adjustment circuit (1 . . . N) 110 includes (a) an adjustment clock input, an adjustment voltage supply input, the first adjustment input, the second adjustment input, an adjustment ground input, and an adjustment clock output, (b) an adjustment inverter circuit 210 logically coupled to the adjustment clock input and logically coupled to the adjustment clock output, (c) an adjustment p-type transistor 212 logically coupled to the first adjustment input, logically coupled to adjustment inverter circuit 210, and logically coupled to the adjustment clock output, (d) a first pull-up p-type transistor 214 logically coupled to the adjustment clock input, electrically coupled to the adjustment voltage supply input, and logically coupled to adjustment p-type transistor 212, (e) an adjustment n-type transistor logically 216 coupled to the second adjustment input, logically coupled to adjustment inverter circuit 210, logically coupled to adjustment p-type transistor 212, and logically coupled to the adjustment clock output, and (f) a first pull-down n-type transistor 218 logically coupled to the adjustment clock input, electrically coupled to the adjustment ground input, and logically coupled to adjustment n-type transistor 216.

In an embodiment, adjustment inverter circuit 210 is logically configured to receive a clock signal on the adjustment clock input. In an embodiment, adjustment p-type transistor 212 is logically configured to receive the at least one first adjustment signal 1 . . . N (e.g., NADJ) on the first adjustment input. In an embodiment, first pull-up p-type transistor 214 is logically configured to receive a clock signal on the adjustment clock input. In an embodiment, adjustment n-type transistor 216 is logically configured to receive the at least one second adjustment signal 1 . . . N (e.g., PADJ) on the second adjustment input. In an embodiment, first pull-down n-type transistor 218 is logically configured to receive a clock signal on the adjustment clock input.

Correction Circuits

In an exemplary embodiment, the at least one correction circuit includes (a) a correction clock input, a correction voltage supply input, the first correction input, the second correction input, a correction ground input, and a correction clock output, (b) a correction inverter circuit logically coupled to the correction clock input and logically coupled to the correction clock output, (c) a correction p-type transistor logically coupled to the first correction input, logically coupled to the correction inverter circuit, and logically coupled to the correction clock output, (d) a second pull-up p-type transistor logically coupled to the correction clock input, electrically coupled to the correction voltage supply input, and logically coupled to the correction p-type transistor, (e) a correction n-type transistor logically coupled to the second correction input, logically coupled to the correction inverter circuit, logically coupled to the correction p-type transistor, and logically coupled to the correction clock output, and (f) a second pull-down n-type transistor logically coupled to the correction clock input, electrically coupled to the correction ground input, and logically coupled to the correction n-type transistor.

Figure 2B:
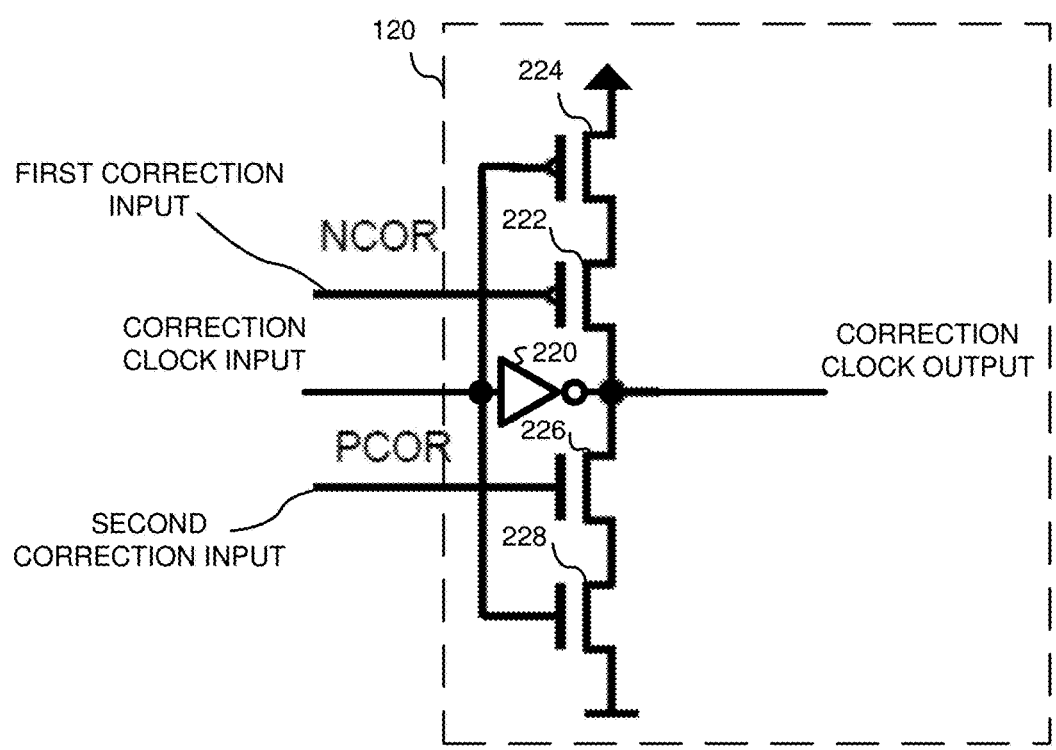
FIG. 2B depicts a circuit diagram in accordance with an embodiment of the present invention.

Referring to FIG. 2B, in an exemplary embodiment, the at least one correction circuit (1 . . . N) 120 includes (a) a correction clock input, a correction voltage supply input, the first correction input, the second correction input, a correction ground input, and a correction clock output, (b) a correction inverter circuit 220 logically coupled to the correction clock input and logically coupled to the correction clock output, (c) a correction p-type transistor 222 logically coupled to the first correction input, logically coupled to correction inverter circuit 220, and logically coupled to the correction clock output, (d) a second pull-up p-type transistor 224 logically coupled to the correction clock input, electrically coupled to the correction voltage supply input, and logically coupled to correction p-type transistor 222, (e) a correction n-type transistor 226 logically coupled to the second correction input, logically coupled to correction inverter circuit 220, logically coupled to correction p-type transistor 222, and logically coupled to the correction clock output, and (f) a second pull-down n-type transistor 228 logically coupled to the correction clock input, electrically coupled to the correction ground input, and logically coupled to correction n-type transistor 226.

In an embodiment, correction inverter circuit 220 is logically configured to receive a clock signal on the correction clock input. In an embodiment, correction p-type transistor 222 is logically configured to receive the at least one first correction signal 1 . . . N (e.g., NCOR) on the first correction input. In an embodiment, second pull-up p-type transistor 224 is logically configured to receive a clock signal on the correction clock input. In an embodiment, correction n-type transistor 226 is logically configured to receive the at least one second correction signal 1 . . . N (e.g., POOR) on the second correction input. In an embodiment, second pull-down n-type transistor 228 is logically configured to receive a clock signal on the correction clock input.

First Implementation

In a particular embodiment, the adjustment clock input of a first adjustment circuit among the at least one adjustment circuit is logically configured to receive the input clock signal, the adjustment clock input of a second adjustment circuit among the at least one adjustment circuit is logically coupled to the adjustment clock output of the first adjustment circuit, the correction clock input of a first correction circuit among the at least one correction circuit is logically coupled to the adjustment clock output of the second adjustment circuit, the correction clock input of a second correction circuit among the at least one correction circuit is logically coupled to the correction clock output of the first correction circuit, and the correction clock output of the second correction circuit is logically configured to transmit the corrected output clock signal.

Figure 3A:
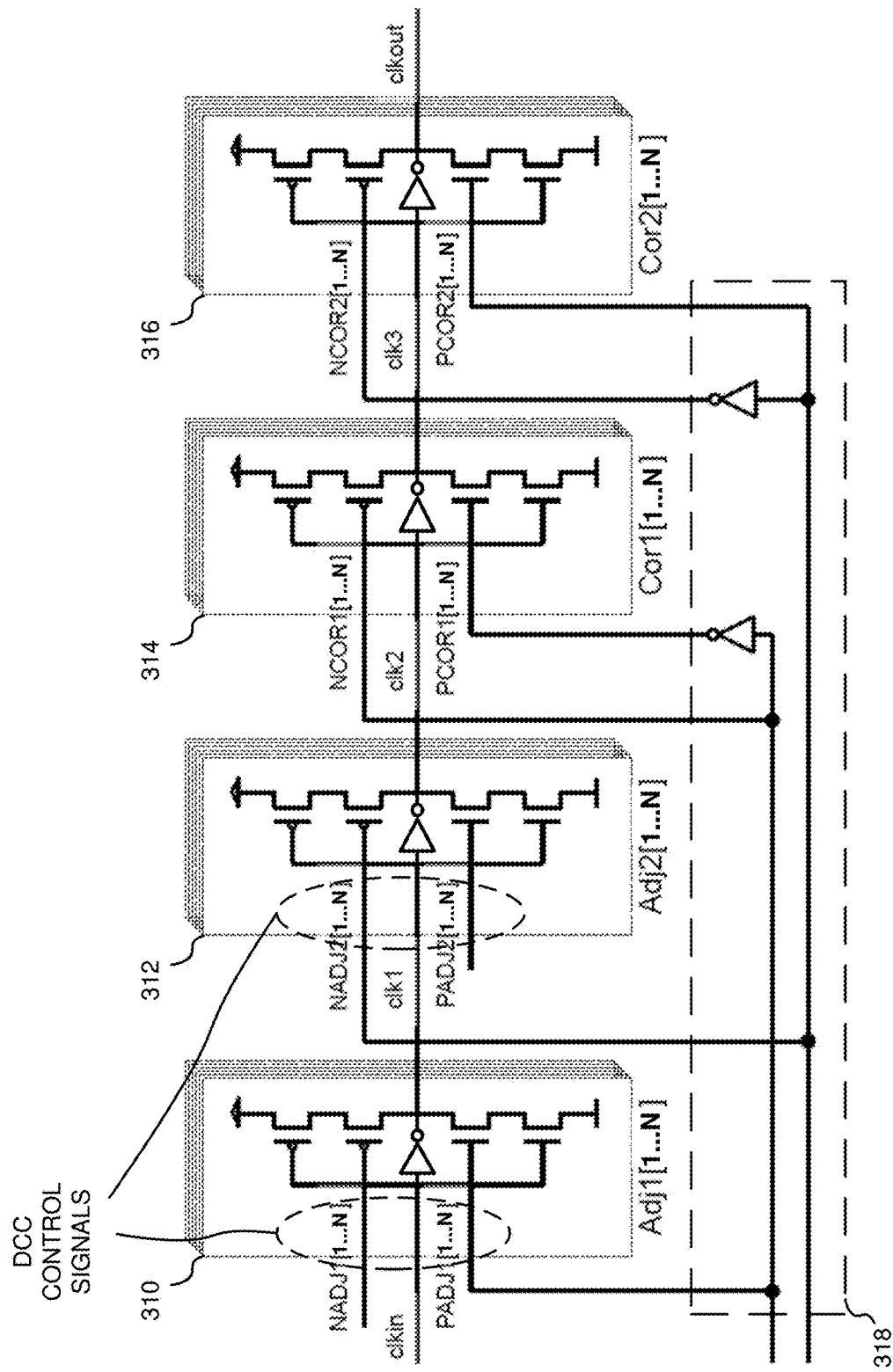
FIG. 3A depicts a circuit diagram in accordance with an embodiment of the present invention.

Referring to FIG. 3A, in a particular embodiment, the adjustment clock input of a first adjustment circuit 310 (e.g., Adj1 (1 . . . N)) among at least one adjustment circuit (1 . . . N) 110 is logically configured to receive the input clock signal (clkin), the adjustment clock input of a second adjustment circuit 312 (e.g., Adj2 (1 . . . N)) among at least one adjustment circuit (1 . . . N) 110 is logically coupled to the adjustment clock output of first adjustment circuit 310, the correction clock input of a first correction circuit 314 (e.g., Cor1 (1 . . . N)) among at least one correction circuit (1 . . . N) 120 is logically coupled to the adjustment clock output of second adjustment circuit 312, the correction clock input of a second correction circuit 316 (e.g., Cor2 (1 . . . N)) among at least one correction circuit (1 . . . N) 120 is logically coupled to the correction clock output of first correction circuit 314, and the correction clock output of second correction circuit 316 is logically configured to transmit the corrected output clock signal (clkout).

In an embodiment, as depicted in FIG. 3A, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 310, the first adjustment input of second adjustment circuit 312, the second adjustment input of first adjustment circuit 310, and the second adjustment input of second adjustment circuit 312. Also in an embodiment, as depicted in FIG. 3A, the DCC control signals are converted, by control circuit 318 implementing Equation 2A, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 314, the first correction input of second correction circuit 316, the second correction input of first correction circuit 314, and the second correction input of second correction circuit 316. In an embodiment, at least one control circuit 105 includes control circuit 318.

$$NCOR1 = PADJ1 \qquad \text{Equation 2A}$$
$$PCOR1 = \text{not}(PADJ1)$$
$$NCOR2 = \text{not}(NADJ2)$$
$$PCOR2 = NADJ2$$

Second Implementation

In a particular embodiment, the adjustment clock input of a first adjustment circuit among the at least one adjustment circuit is logically configured to receive the input clock signal, the correction clock input of a first correction circuit among the at least one correction circuit is logically coupled to the adjustment clock output of the first adjustment circuit, the adjustment clock input of a second adjustment circuit among the at least one adjustment circuit is logically coupled to the correction clock output of the first correction circuit, the correction clock input of a second correction circuit among the at least one correction circuit is logically coupled to the adjustment clock output of the second adjustment circuit, and the correction clock output of the second correction circuit is logically configured to transmit the corrected output clock signal.

Figure 3B:
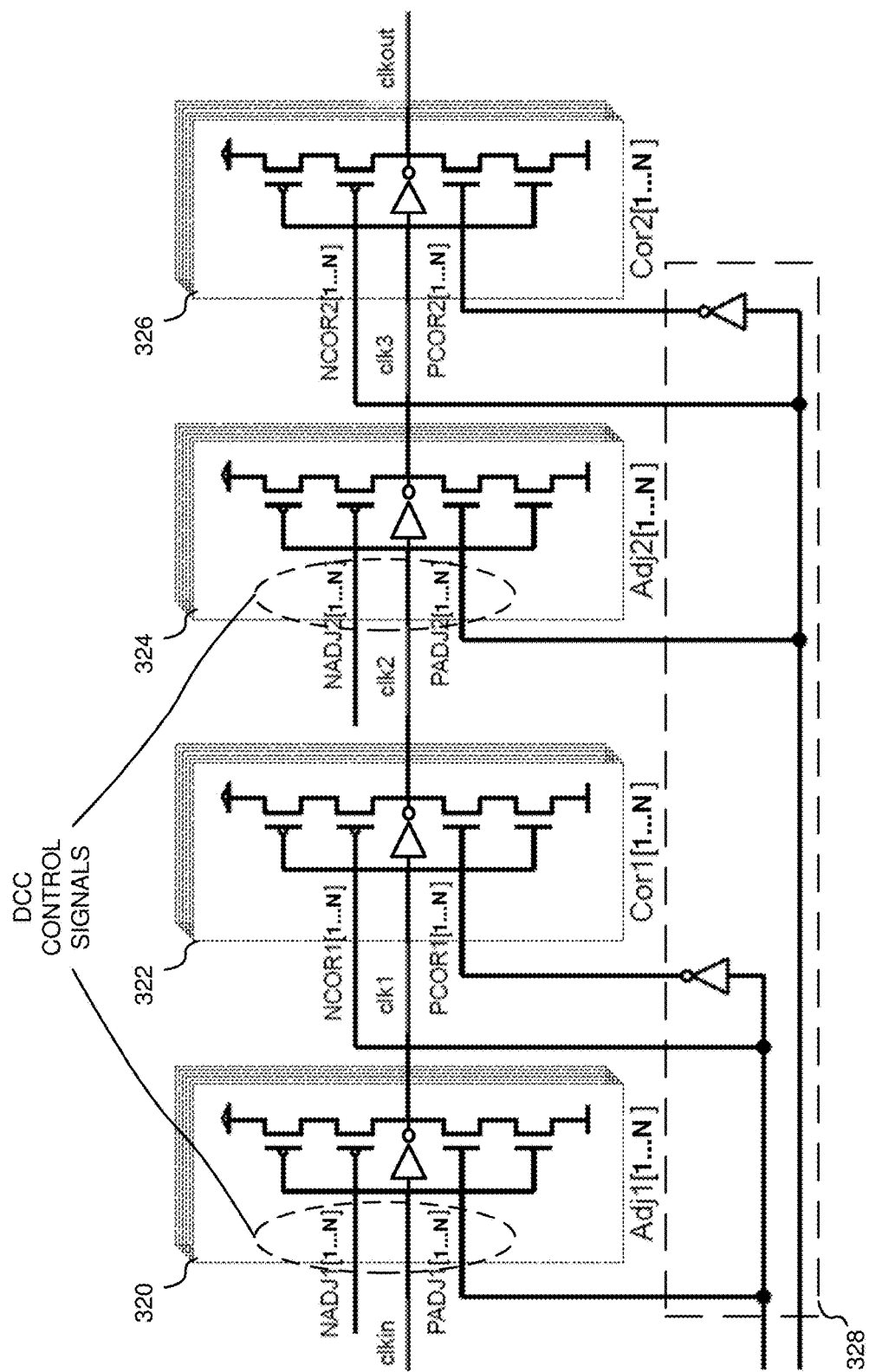
FIG. 3B depicts a circuit diagram in accordance with an embodiment of the present invention.

Referring to FIG. 3B, in a particular embodiment, the adjustment clock input of a first adjustment circuit 320 among at least one adjustment circuit (1 . . . N) 110 is logically configured to receive the input clock signal (clkin), the correction clock input of a first correction circuit 322 among at least one correction circuit (1 . . . N) 120 is logically coupled to the adjustment clock output of first adjustment circuit 320, the adjustment clock input of a second adjustment circuit 324 among at least one adjustment circuit (1 . . . N) 110 is logically coupled to the correction clock output of first correction circuit 322, the correction clock input of a second correction circuit 326 among at least one correction circuit (1 . . . N) 120 is logically coupled to the adjustment clock output of second adjustment circuit 324, and the correction clock output of second correction circuit 326 is logically configured to transmit the corrected output clock signal (clkout).

In an embodiment, as depicted in FIG. 3B, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 320, the first adjustment input of second adjustment circuit 324, the second adjustment input of first adjustment circuit 320, and the second adjustment input of second adjustment circuit 324. Also in an embodiment, as depicted in FIG. 3B, the DCC control signals are converted, by control circuit 328 implementing Equation 2B, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 322, the first correction input of second correction circuit 326, the second correction input of first correction circuit 322, and the second correction input of second correction circuit 326. In an embodiment, at least one control circuit 105 includes control circuit 328.

$$NCOR1 = PADJ1$$
$$PCOR1 = \text{not}(PADJ1)$$
$$NCOR2 = PADJ2$$
$$PCOR2 = \text{not}(PADJ2)$$

Equation 2B

Fourth Implementation

In a particular embodiment, the adjustment clock input of a first adjustment circuit among the at least one adjustment circuit is logically configured to receive the input clock signal, the correction clock input of a first correction circuit among the at least one correction circuit is logically coupled to the adjustment clock output of the first adjustment circuit, the correction clock input of a second correction circuit among the at least one correction circuit is logically coupled to the correction clock output of the first correction circuit, the adjustment clock input of a second adjustment circuit among the at least one adjustment circuit is logically coupled to the correction clock output of the second correction circuit, and the adjustment clock output of the second adjustment circuit is logically configured to transmit the corrected output clock signal.

Figure 3C:
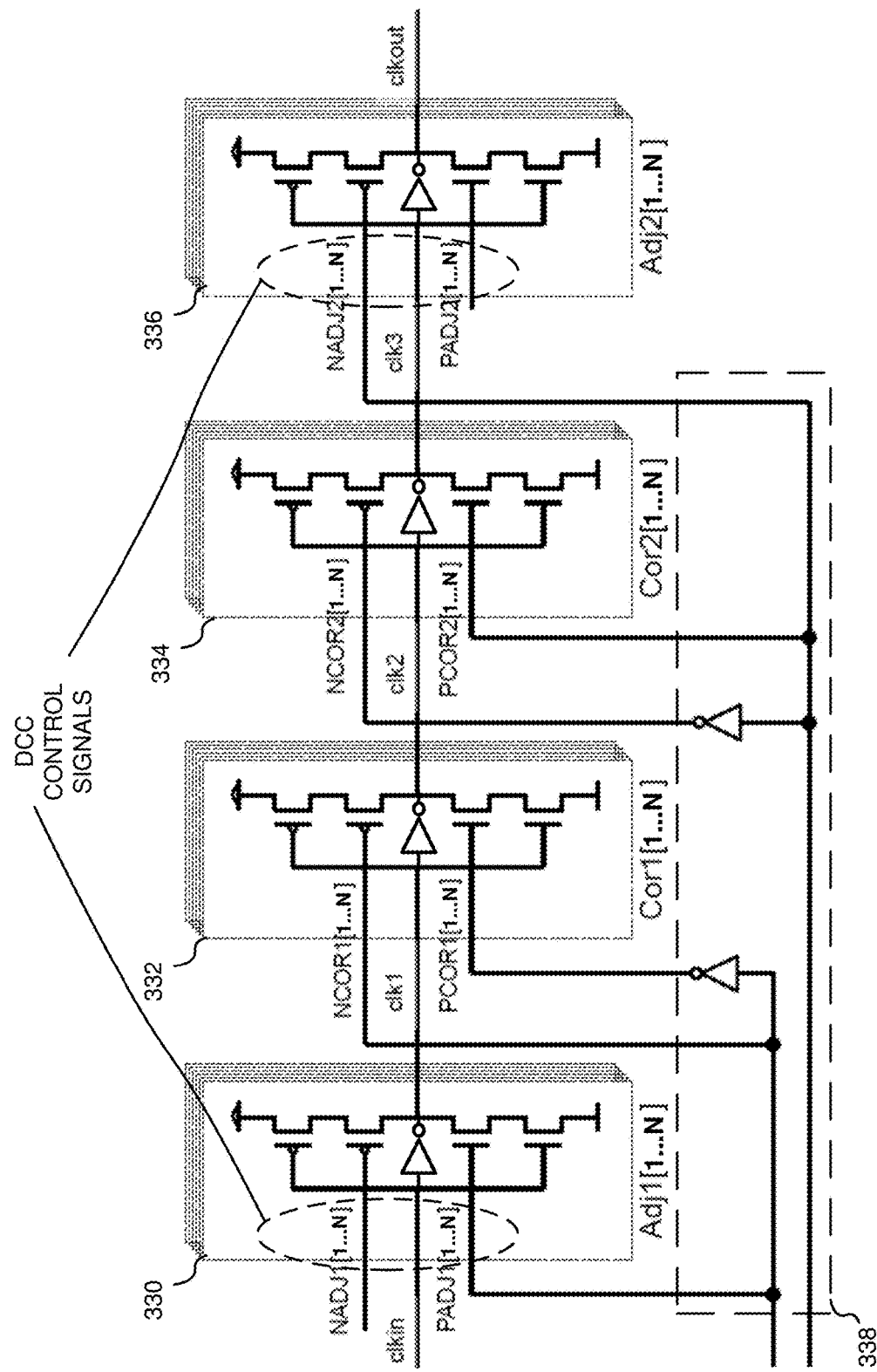
FIG. 3C depicts a circuit diagram in accordance with an embodiment of the present invention.

Referring to FIG. 3C, in a particular embodiment, the adjustment clock input of a first adjustment circuit 330 among at least one adjustment circuit (1 . . . N) 110 is logically configured to receive the input clock signal (clkin), the correction clock input of a first correction circuit 332 among at least one correction circuit (1 . . . N) 120 is logically coupled to the adjustment clock output of first adjustment circuit 330, the correction clock input of a second correction circuit 334 among at least one correction circuit (1 . . . N) 120 is logically coupled to the correction clock output of first correction circuit 332, the adjustment clock input of a second adjustment circuit 336 among at least one adjustment circuit (1 . . . N) 110 is logically coupled to the correction clock output of second correction circuit 334, and the adjustment clock output of second adjustment circuit 336 is logically configured to transmit the corrected output clock signal (clkout).

In an embodiment, as depicted in FIG. 3C, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 330, the first adjustment input of second adjustment circuit 336, the second adjustment input of first adjustment circuit 330, and the second adjustment input of second adjustment circuit 336. Also in an embodiment, as depicted in FIG. 3C, the DCC control signals are converted, by control circuit 338 implementing Equation 2C, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 332, the first correction input of second correction circuit 334, the second correction input of first correction circuit 332, and the second correction input of second correction circuit 334. In an embodiment, at least one control circuit 105 includes control circuit 338.

$$NCOR1 = PADJ1$$
$$PCOR1 = \text{not}(PADJ1)$$
$$NCOR2 = \text{not}(NADJ2)$$
$$PCOR2 = NADJ2$$

Equation 2C

Fifth Implementation

In a particular embodiment, the correction clock input of a first correction circuit among the at least one correction circuit is logically configured to receive the input clock signal, the adjustment clock input of a first adjustment circuit among the at least one adjustment circuit is logically coupled to the correction clock output of the first correction circuit, the correction clock input of a second correction circuit among the at least one correction circuit is logically coupled to the adjustment clock output of the first adjustment circuit, the adjustment clock input of a second adjustment circuit among the at least one adjustment circuit is logically coupled to the correction clock output of the second correction circuit, and the adjustment clock output of the second adjustment circuit is logically configured to transmit the corrected output clock signal.

Figure 3D:
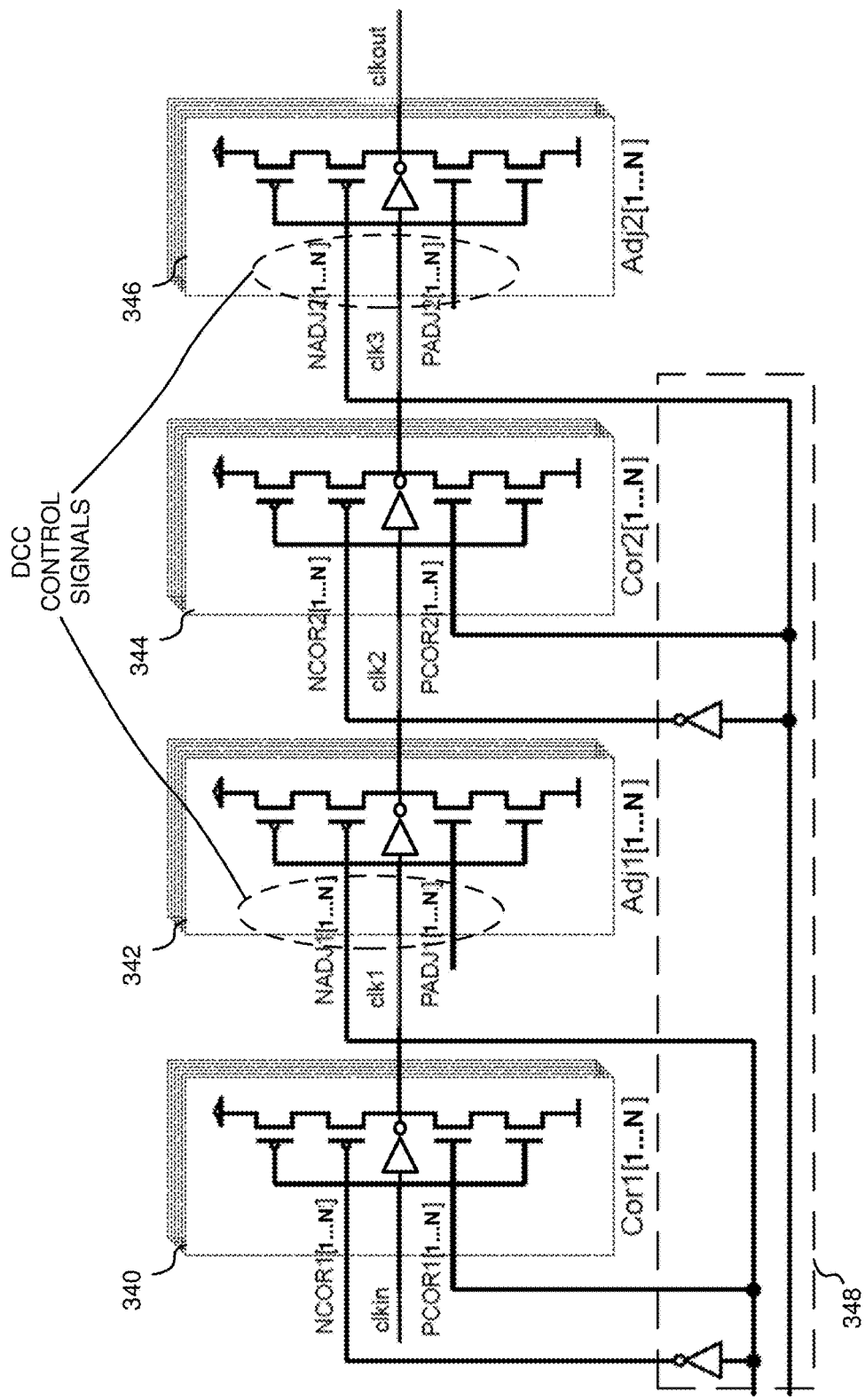
FIG. 3D depicts a circuit diagram in accordance with an embodiment of the present invention.

Referring to FIG. 3D, in a particular embodiment, the correction clock input of a first correction circuit 340 among at least one correction circuit (1 . . . N) 120 is logically configured to receive the input clock signal (clkin), the adjustment clock input of a first adjustment circuit 342 among at least one adjustment circuit (1 . . . N) 110 is logically coupled to the correction clock output of first correction circuit 340, the correction clock input of a second correction circuit 344 among at least one correction circuit (1 . . . N) 120 is logically coupled to the adjustment clock output of first adjustment circuit 342, the adjustment clock input of a second adjustment circuit 346 among at least one adjustment circuit (1 . . . N) 110 is logically coupled to the correction clock output of second correction circuit 344, and the adjustment clock output of second adjustment circuit 346 is logically configured to transmit the corrected output clock signal (clkout).

In an embodiment, as depicted in FIG. 3D, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 342, the first adjustment input of second adjustment circuit 346, the second adjustment input of first adjustment circuit 342, and the second adjustment input of second adjustment circuit 346. Also in an embodiment, as depicted in FIG. 3D, the DCC control signals are converted, by control circuit 348 implementing Equation 2D, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 340, the first correction input of second correction circuit 344, the second correction input of first correction circuit 340, and the second correction input of second correction circuit 344. In an embodiment, at least one control circuit 105 includes control circuit 348.

$$NCOR1 = \text{not}(NADJ1)$$
$$PCOR1 = NADJ1$$
$$NCOR2 = \text{not}(NADJ2)$$
$$PCOR2 = NADJ2$$

Equation 2D

Sixth Implementation

In a particular embodiment, the correction clock input of a first correction circuit among the at least one correction circuit is logically configured to receive the input clock signal, the correction clock input of a second correction circuit among the at least one correction circuit is logically coupled to the correction clock output of the first correction circuit, the adjustment clock input of a first adjustment circuit among the at least one adjustment circuit is logically coupled to the correction clock output of the second correction circuit, the adjustment clock input of a second adjustment circuit among the at least one adjustment circuit is logically coupled to the adjustment clock output of the first adjustment circuit, and the adjustment clock output of the second adjustment circuit is logically configured to transmit the corrected output clock signal.

Figure 3E:
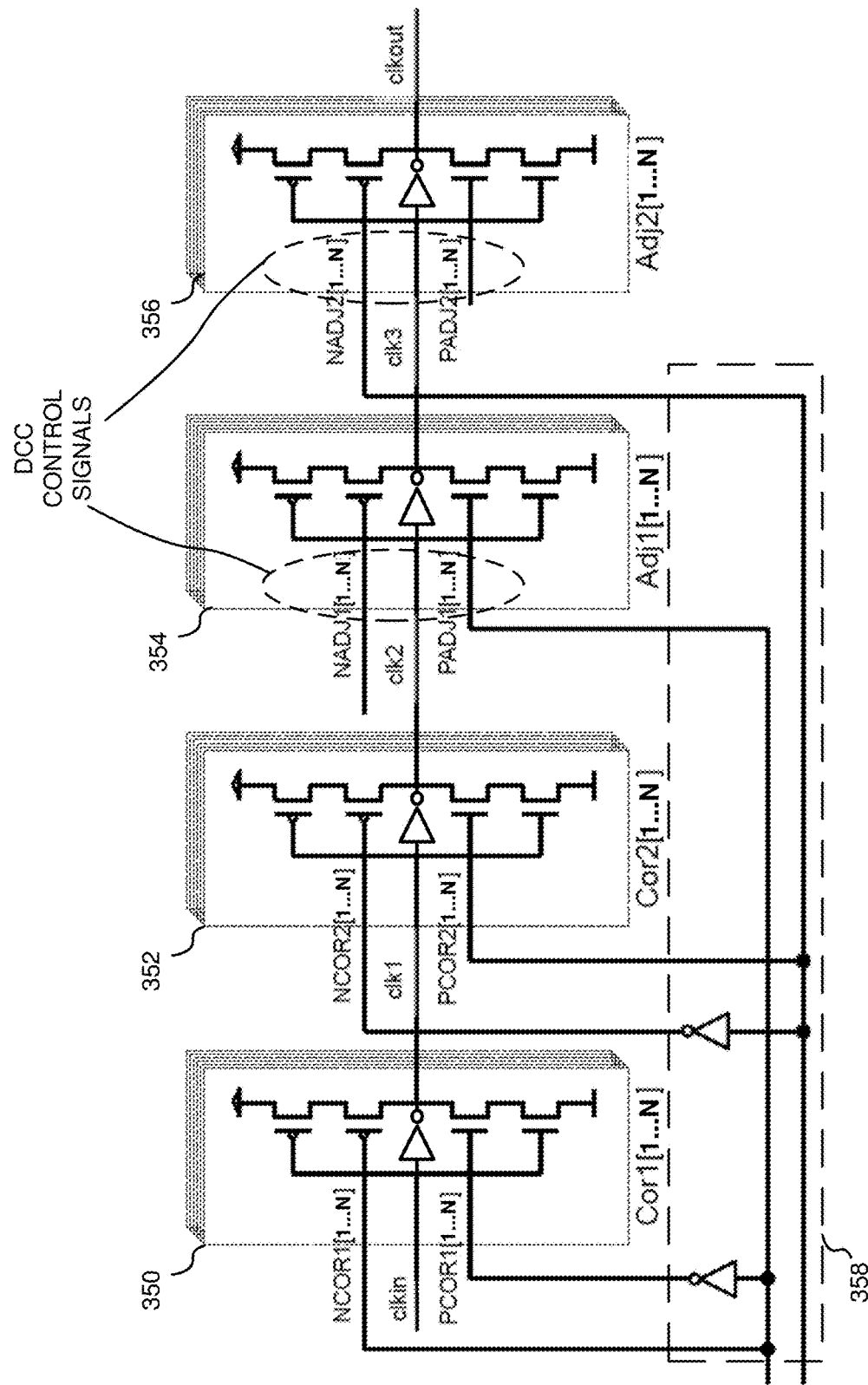
FIG. 3E depicts a circuit diagram in accordance with an embodiment of the present invention.

Referring to FIG. 3E, in a particular embodiment, the correction clock input of a first correction circuit 350 among at least one correction circuit (1 . . . N) 120 is logically configured to receive the input clock signal (clkin), the correction clock input of a second correction circuit 352 among at least one correction circuit (1 . . . N) 120 is logically coupled to the correction clock output of first correction circuit 350, the adjustment clock input of a first adjustment circuit 354 among at least one adjustment circuit (1 . . . N) 110 is logically coupled to the correction clock output of second correction circuit 352, the adjustment clock input of a second adjustment circuit 356 among at least one adjustment circuit (1 . . . N) 110 is logically coupled to the adjustment clock output of first adjustment circuit 354, and the adjustment clock output of second adjustment circuit 356 is logically configured to transmit the corrected output clock signal (clkout).

In an embodiment, as depicted in FIG. 3E, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 354, the first adjustment input of second adjustment circuit 356, the second adjustment input of first adjustment circuit 354, and the second adjustment input of second adjustment circuit 356. Also in an embodiment, as depicted in FIG. 3E, the DCC control signals are converted, by control circuit 358 implementing Equation 2E, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 350, the first correction input of second correction circuit 352, the second correction input of first correction circuit 350, and the second correction input of second correction circuit 352. In an embodiment, at least one control circuit 105 includes control circuit 358.

$$NCOR1 = PADJ1$$
$$PCOR1 = \text{not}(PADJ1)$$
$$NCOR2 = \text{not}(NADJ2)$$
$$PCOR2 = NADJ2$$

Equation 2E

Seventh Implementation

In a particular embodiment, the correction clock input of a first correction among the at least one correction circuit is logically configured to receive the input clock signal, the adjustment clock input of a first adjustment circuit among the at least one adjustment circuit is logically coupled to the correction clock output of the first correction circuit, the adjustment clock input of a second adjustment circuit among the at least one adjustment circuit is logically coupled to the adjustment clock output of the first adjustment circuit, the correction clock input of a second correction circuit among the at least one correction circuit is logically coupled to the adjustment clock output of the second adjustment circuit, and the correction clock output of the second correction circuit is logically configured to transmit the corrected output clock signal.

Figure 3F:
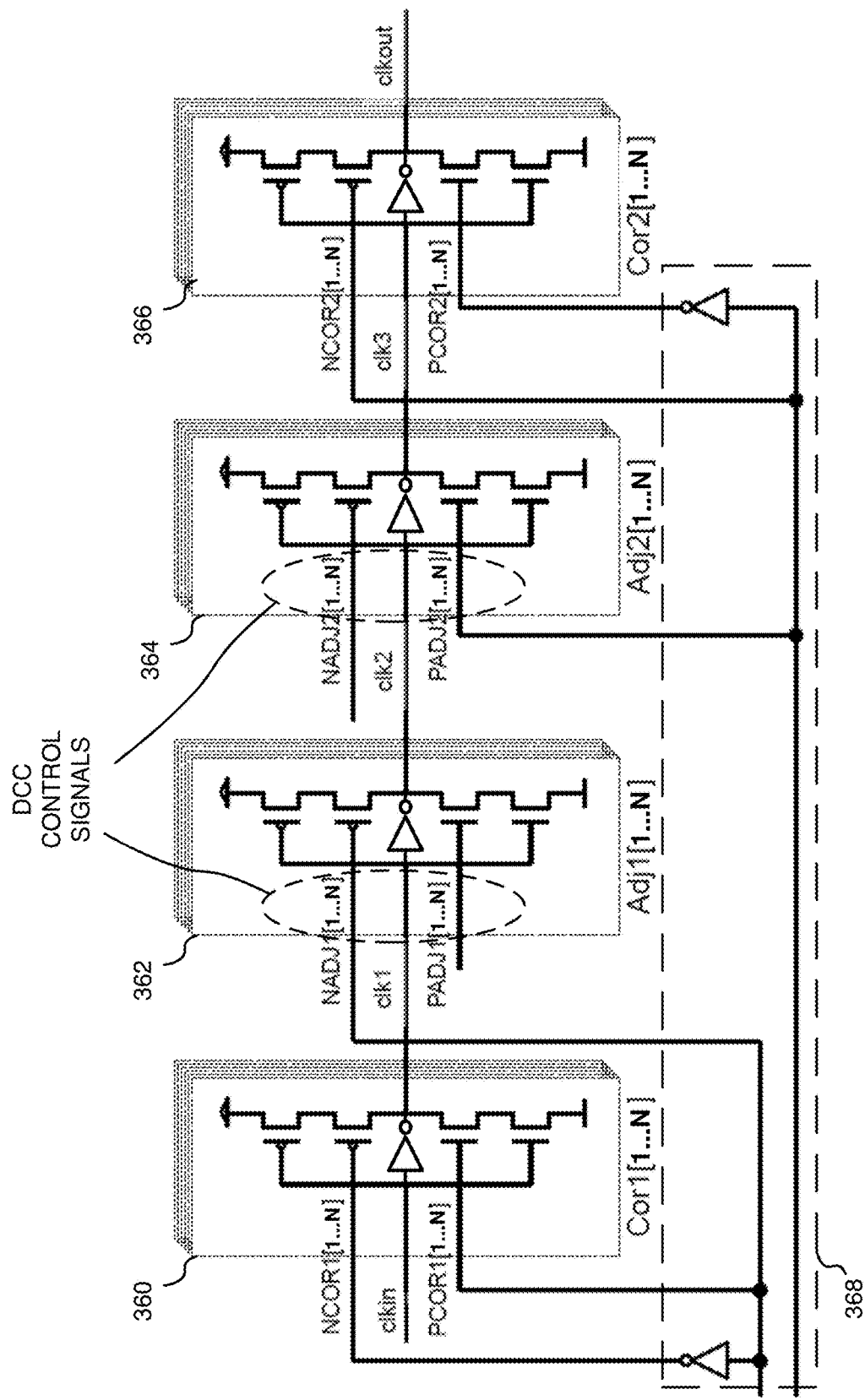
FIG. 3F depicts a circuit diagram in accordance with an embodiment of the present invention.

Referring to FIG. 3F, in a particular embodiment, the correction clock input of a first correction circuit 360 among at least one correction circuit (1 . . . N) 120 is logically configured to receive the input clock signal (clkin), the adjustment clock input of a first adjustment circuit 362 among at least one adjustment circuit (1 . . . N) 110 is logically coupled to the correction clock output of first correction circuit 360, the adjustment clock input of a second adjustment circuit 364 among at least one adjustment circuit (1 . . . N) 110 is logically coupled to the adjustment clock output of first adjustment circuit 362, the correction clock input of a second correction circuit 366 among at least one correction circuit (1 . . . N) 120 is logically coupled to the adjustment clock output of second adjustment circuit 364, and the correction clock output of second correction circuit 366 is logically configured to transmit the corrected output clock signal (clkout).

In an embodiment, as depicted in FIG. 3F, the DCC control signals are transmitted as first adjustment signals 1 . . . N (e.g., NADJ1 (1 . . . N), NADJ2 (1 . . . N)) and second adjustment signals 1 . . . N (PADJ1 (1 . . . N), PADJ2 (1 . . . N)), and are respectively received on the first adjustment input of first adjustment circuit 362, the first adjustment input of second adjustment circuit 364, the second adjustment input of first adjustment circuit 362, and the second adjustment input of second adjustment circuit 364. Also in an embodiment, as depicted in FIG. 3F, the DCC control signals are converted, by control circuit 368 implementing Equation 2F, into first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)), where the first correction signals 1 . . . N (e.g., NCOR1 (1 . . . N), NCOR2 (1 . . . N)) and second correction signals 1 . . . N (e.g., PCOR1 (1 . . . N), PCOR2 (1 . . . N)) are respectively received by the first correction input of first correction circuit 360, the first correction input of second correction circuit 366, the second correction input of first correction circuit 360, and the second correction input of second correction circuit 366. In an embodiment, at least one control circuit 105 includes control circuit 368.

$$NCOR1 = \text{not}(NADJ1)$$
$$PCOR1 = NADJ1$$
$$NCOR2 = PADJ2$$
$$PCOR2 = \text{not}(PADJ2)$$

Equation 2F

Third Implementation

System

Figure 4:
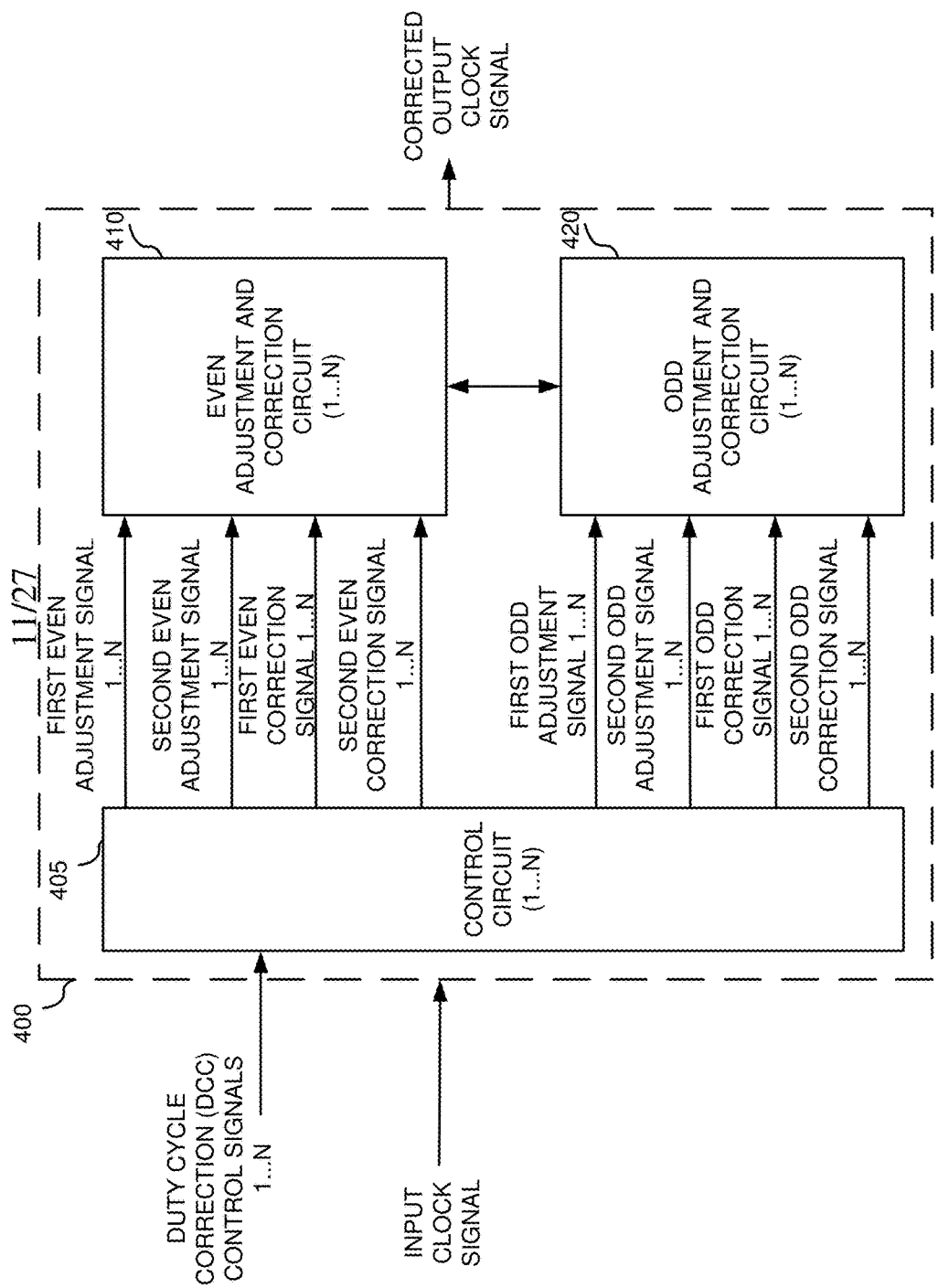
FIG. 4 depicts a block diagram in accordance with an exemplary embodiment of the present invention.

Referring to FIG. 4, in an alternative embodiment, the present invention provides a system 400 of correcting duty cycle and compensating for active clock edge shift for electronic circuits. In an alternative embodiment, system 400 includes (1) at least one control circuit (1 . . . N) 405 logically configured to receive duty cycle correction (DCC) control signals 1 . . . N and logically configured to output at least one first even adjustment signal 1 . . . N, at least one second even adjustment signal 1 . . . N, at least one first even correction signal 1 . . . N, at least one second even correction signal 1 . . . N, at least one first odd adjustment signal 1 . . . N, at least one second odd adjustment signal 1 . . . N, at least one first odd correction signal 1 . . . N, and at least one odd even correction signal 1 . . . N, (2) at least one even adjustment and correction circuit (1 . . . N) 410 logically coupled to at least one control circuit (1 . . . N) 405 and logically configured to change a duty cycle value of an input clock signal in response to receiving the at least one first even adjustment signal 1 . . . N on a first even adjustment input, the at least one second even adjustment signal 1 . . . N on a second even adjustment input, the at least one first even correction signal 1 . . . N on a first even correction input, and the at least one second even correction signal 1 . . . N on a second even correction input, (3) at least one odd adjustment and correction circuit (1 . . . N) 420 logically coupled to at least one control circuit (1 . . . N) 405, logically coupled to at least one even adjustment and correction circuit (1 . . . N) 410, and logically configured to compensate for a shift of an active clock edge of the input clock signal in response to receiving the at least one first odd adjustment signal 1 . . . N on a first odd adjustment input, the at least one second odd adjustment signal 1 . . . N on a second odd adjustment input, the at least one first odd correction signal 1 . . . N on a first odd correction input, and the at least one second odd correction signal 1 . . . N on a second odd correction input, (4) where one of a set of at least one even adjustment and correction circuit (1 . . . N) 410 and at least one odd adjustment and correction circuit (1 . . . N) 420 is logically configured to receive the input clock signal, and (5) where one of the set of at least one even adjustment and correction circuit (1 . . . N) 410 and at least one odd adjustment and correction circuit (1 . . . N) 420 is logically configured to transmit a corrected output clock signal, in response to at least one even adjustment and correction circuit (1 . . . N) 410 receiving the at least one first even adjustment signal 1 . . . N, the at least one second even adjustment signal 1 . . . N, the at least one first even correction signal 1 . . . N, and the at least one second even correction signal 1 . . . N and in response to at least one odd adjustment and correction circuit (1 . . . N) 420 receiving the at least one first odd adjustment signal 1 . . . N, the at least one second odd adjustment signal 1 . . . N, the at least one first odd correction signal 1 . . . N, and the at least one second odd correction signal 1 . . . N.

Method

In an alternative embodiment, the present invention provides a method of correcting duty cycle and compensating for active clock edge shift for electronic circuits. In an alternative embodiment, method includes (1) receiving an input clock signal by one of a set of at least one even adjustment and correction circuit and at least one odd adjustment and correction circuit, where the at least one odd adjustment and correction circuit is logically coupled to the at least one even adjustment and correction circuit, (2) in response to receiving duty cycle correction control signals by at least one control circuit logically coupled to the at least one even adjustment and correction circuit and logically coupled to the at least one odd adjustment and correction circuit, outputting at least one first even adjustment signal, at least one second even adjustment signal, at least one first even correction signal, at least one second even correction signal, at least one first odd adjustment signal, at least one second odd adjustment signal, at least one first odd correction signal, and at least one odd even correction signal, by the at least one control circuit, (3) in response to receiving by the at least one even adjustment and correction circuit the at least one first even adjustment signal on a first even adjustment input, the at least one second even adjustment signal on a second even adjustment input, the at least one first even correction signal on a first even correction input, and the at least one second even correction signal on a second even correction input, changing by the at least one even adjustment and correction circuit a duty cycle value of an input clock signal, (4) in response to receiving by the at least one odd adjustment and correction circuit the at least one first odd adjustment signal on a first odd adjustment input, the at least one second odd adjustment signal on a second odd adjustment input, the at least one first odd correction signal on a first odd correction input, and the at least one second odd correction signal on a second odd correction input, compensating by the at least one odd adjustment and correction circuit for a shift of an active clock edge of the input clock signal, and (5) in response to the at least one even adjustment and correction circuit receiving the at least one first even adjustment signal, the at least one second even adjustment signal, the at least one first even correction signal, and the at least one second even correction signal and in response to the at least one odd adjustment and correction circuit receiving the at least one first odd adjustment signal, the at least one second odd adjustment signal, the at least one first odd correction signal, and the at least one second odd correction signal, transmitting a corrected output clock signal by one of the set of the at least one even adjustment and correction circuit and the at least one odd adjustment and correction circuit.

Implementation

Even Adjustment and Correction Circuit

In an exemplary embodiment, the at least one even adjustment and correction circuit includes (a) an even clock input, an even voltage supply input, a first even adjustment input, a second even adjustment input, a first even correction input, a second even correction input, an even ground input, and an even clock output, (b) an even adjustment inverter circuit logically coupled to the even clock input and logically coupled to the even clock output, (c) an even adjustment p-type transistor logically coupled to the first even adjustment input, logically coupled to the even adjustment inverter circuit, and logically coupled to the even clock output, (d) a first even pull-up p-type transistor logically coupled to the even clock input, electrically coupled to the even voltage supply input, and logically coupled to the even adjustment p-type transistor, (e) an even adjustment n-type transistor logically coupled to the second even adjustment input, logically coupled to the even adjustment inverter circuit, logically coupled to the even adjustment p-type transistor, and logically coupled to the even clock output, (f) a first even pull-down n-type transistor logically coupled to the even clock input, electrically coupled to the even ground input, and logically coupled to the even adjustment n-type transistor, (g) an even correction inverter circuit logically coupled to the even clock input and logically coupled to the even clock output, (h) an even correction p-type transistor logically coupled to the first even correction input, logically coupled to the even correction inverter circuit, and logically coupled to the even clock output, (i) a second even pull-up p-type transistor logically coupled to the even clock input, electrically coupled to the even voltage supply input, and logically coupled to the even correction p-type transistor, (j) a even correction n-type transistor logically coupled to the second even correction input, logically coupled to the even correction inverter circuit, logically coupled to the even correction p-type transistor, and logically coupled to the even clock output, and (k) a second even pull-down n-type transistor logically coupled to the even clock input, electrically coupled to the even adjustment ground input, and logically coupled to the even correction n-type transistor.

Figure 5A:
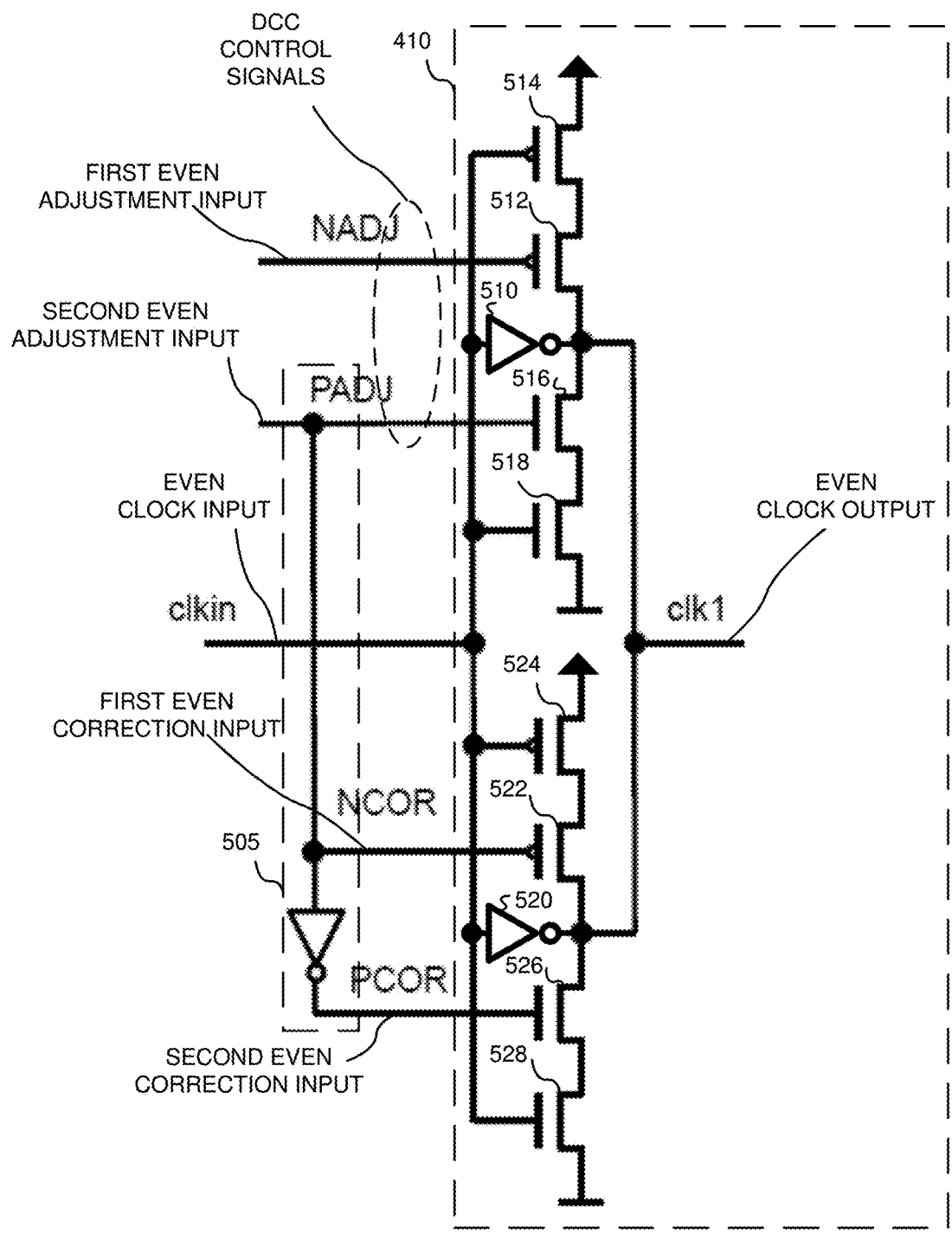
FIG. 5A depicts a circuit diagram in accordance with an embodiment of the present invention.

Referring to FIG. 5A, in an exemplary embodiment, at least one even adjustment and correction circuit (1 . . . N) 410 includes (a) an even clock input, an even voltage supply input, a first even adjustment input, a second even adjustment input, a first even correction input, a second even correction input, an even ground input, and an even clock output, (b) an even adjustment inverter circuit 510 logically coupled to the even clock input and logically coupled to the even clock output, (c) an even adjustment p-type transistor 512 logically coupled to the first even adjustment input, logically coupled to even adjustment inverter circuit 510, and logically coupled to the even clock output, (d) a first even pull-up p-type transistor 514 logically coupled to the even clock input, electrically coupled to the even voltage supply input, and logically coupled to even adjustment p-type transistor 512, (e) an even adjustment n-type transistor 516 logically coupled to the second even adjustment input, logically coupled to even adjustment inverter circuit 510, logically coupled to even adjustment p-type transistor 512, and logically coupled to the even clock output, (f) a first even pull-down n-type transistor 518 logically coupled to the even clock input, electrically coupled to the even ground input, and logically coupled to even adjustment n-type transistor 516, (g) an even correction inverter circuit 520 logically coupled to the even clock input and logically coupled to the even clock output, (h) an even correction p-type transistor 522 logically coupled to the first even correction input, logically coupled to even correction inverter circuit 520, and logically coupled to the even clock output, (i) a second even pull-up p-type transistor 524 logically coupled to the even clock input, electrically coupled to the even voltage supply input, and logically coupled to even correction p-type transistor 522, (j) an even correction n-type transistor 526 logically coupled to the second even correction input, logically coupled to even correction inverter circuit 520, logically coupled to even correction p-type transistor 522, and logically coupled to the even clock output, and (k) a second even pull-down n-type transistor 528 logically coupled to the even clock input, electrically coupled to the even ground input, and logically coupled to even correction n-type transistor 522.

In an embodiment, even adjustment inverter circuit 510 is logically configured to receive a clock signal (e.g., clkin) on the even clock input. In an embodiment, even adjustment p-type transistor 512 is logically configured to receive the first even adjustment signal (e.g., NADJ) on the first even adjustment input. In an embodiment, first even pull-up p-type transistor 514 is logically configured to receive the clock signal (e.g., clkin) on the even clock input. In an embodiment, even adjustment n-type transistor 516 is logically configured to receive the second even adjustment signal (e.g., PADJ) on the second adjustment input. In an embodiment, first even pull-down n-type transistor 518 is logically configured to receive the clock signal (e.g., clkin) on the even clock input. In an embodiment, even correction inverter circuit 520 is logically configured to receive the clock signal (e.g., clkin) on the even clock input. In an embodiment, even correction p-type transistor 522 is logically configured to receive the first even correction signal (e.g., NCOR) on the first even correction input. In an embodiment, second even pull-up p-type transistor 524 is logically configured to receive the clock signal (e.g., clkin) on the even clock input. In an embodiment, even correction n-type transistor 526 is logically configured to receive the second even correction signal (e.g., PCOR) on the second even correction input. In an embodiment, second even pull-down n-type transistor 528 is logically configured to receive the clock signal (e.g., clkin) on the even clock input.

In an embodiment, as depicted in FIG. 5A, the DCC control signals are transmitted as the first even adjustment signal (e.g., NADJ) and the second even adjustment signal (e.g., PADJ) and are respectively received on the first even adjustment input and on the second even adjustment input of at least one even adjustment and correction circuit (1 . . . N) 410. Also in an embodiment, as depicted in FIG. 5A, the DCC control signals are converted, by a control circuit 505, into the first even correction signal (e.g., NCOR) and the second even correction signal (e.g., PCOR), where the first even correction signal (e.g., NCOR) and the second even correction signal (e.g., PCOR) are respectively received on the first even correction input and on the second even correction input of at least one even adjustment and correction circuit (1 . . . N) 410.

Odd Adjustment and Correction Circuit

In an exemplary embodiment, the at least one odd adjustment and correction circuit includes (a) an odd clock input, an odd voltage supply input, a first odd adjustment input, a second odd adjustment input, a first odd correction input, a second odd correction input, an odd ground input, and an odd clock output, (b) an odd adjustment inverter circuit logically coupled to the odd clock input and logically coupled to the odd clock output, (c) an odd adjustment p-type transistor logically coupled to the first odd adjustment input, logically coupled to the odd adjustment inverter circuit, and logically coupled to the odd clock output, (d) a first odd pull-up p-type transistor logically coupled to the odd clock input, electrically coupled to the odd voltage supply input, and logically coupled to the odd adjustment p-type transistor, (e) an odd adjustment n-type transistor logically coupled to the second odd adjustment input, logically coupled to the odd adjustment inverter circuit, logically coupled to the odd adjustment p-type transistor, and logically coupled to the odd clock output, (f) a first odd pull-down n-type transistor logically coupled to the odd clock input, electrically coupled to the odd ground input, and logically coupled to the odd adjustment n-type transistor, (g)

an odd correction inverter circuit logically coupled to the odd clock input and logically coupled to the odd clock output, (h) an odd correction p-type transistor logically coupled to the first odd correction input, logically coupled to the odd correction inverter circuit, and logically coupled to the odd clock output, (i) a second odd pull-up p-type transistor logically coupled to the odd clock input, electrically coupled to the odd voltage supply input, and logically coupled to the odd correction p-type transistor, (j) an odd correction n-type transistor logically coupled to the second odd correction input, logically coupled to the odd correction inverter circuit, logically coupled to the odd correction p-type transistor, and logically coupled to the odd clock output, and (k) a second odd pull-down n-type transistor logically coupled to the odd clock input, electrically coupled to the odd ground input, and logically coupled to the odd correction n-type transistor.

Figure 5B:
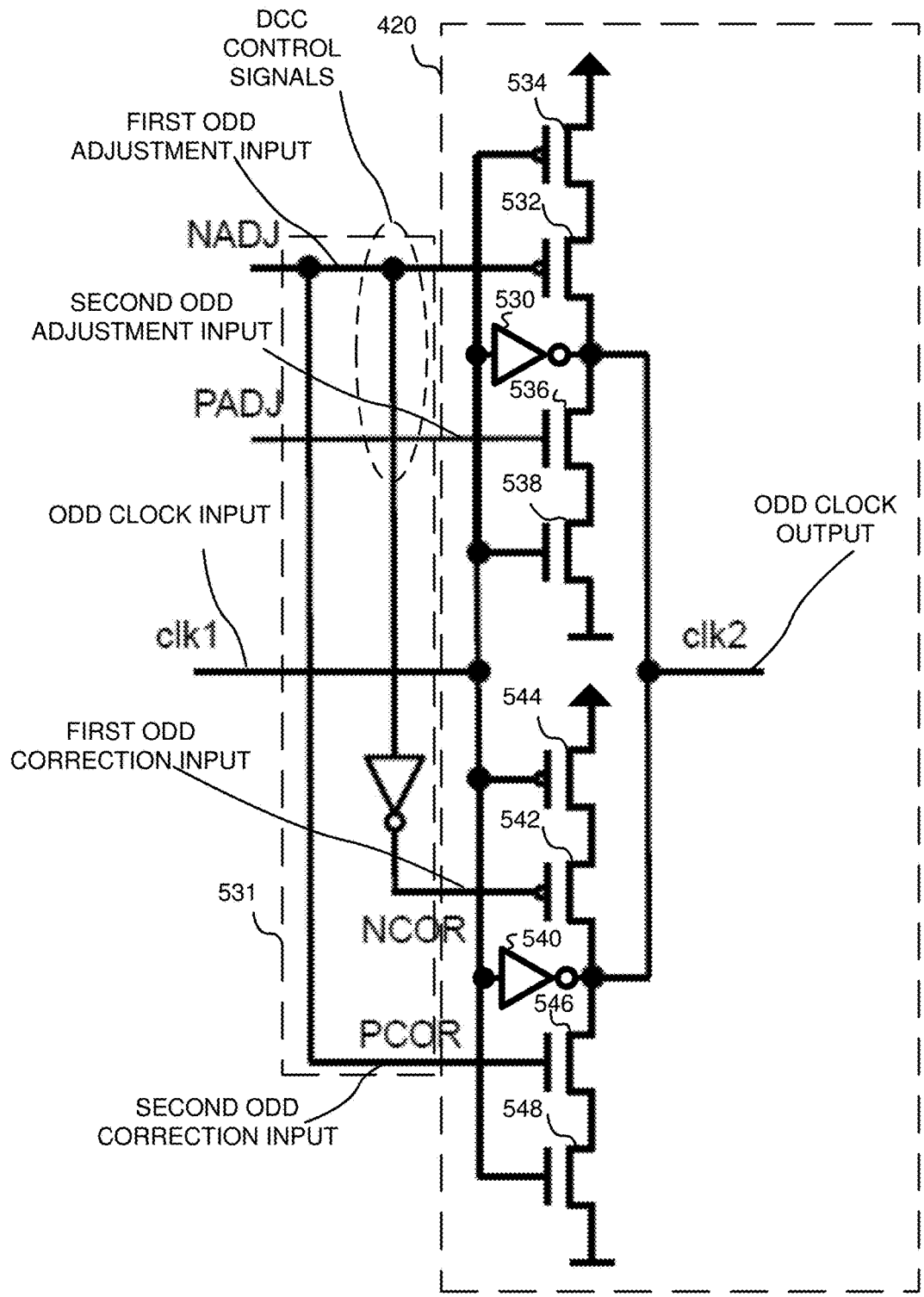
FIG. 5B depicts a circuit diagram in accordance with an embodiment of the present invention.

Referring to FIG. 5B, in an exemplary embodiment, at least one odd adjustment and correction circuit (1 . . . N) 420 includes (a) an odd clock input, an odd voltage supply input, a first odd adjustment input, a second odd adjustment input, a first odd correction input, a second odd correction input, an odd ground input, and an odd clock output, (b) an odd adjustment inverter circuit 530 logically coupled to the odd clock input and logically coupled to the odd clock output, (c) an odd adjustment p-type transistor 532 logically coupled to the first odd adjustment input, logically coupled to odd adjustment inverter circuit 530, and logically coupled to the odd clock output, (d) a first odd pull-up p-type transistor 534 logically coupled to the odd clock input, electrically coupled to the odd voltage supply input, and logically coupled to odd adjustment p-type transistor 532, (e) an odd adjustment n-type transistor 536 logically coupled to the second odd adjustment input, logically coupled to odd adjustment inverter circuit 530, logically coupled to odd adjustment p-type transistor 532, and logically coupled to the odd clock output, (f) a first odd pull-down n-type transistor 538 logically coupled to the odd clock input, electrically coupled to the odd ground input, and logically coupled to odd adjustment n-type transistor 536, (g) an odd correction inverter circuit 540 logically coupled to the odd clock input and logically coupled to the odd clock output, (h) an odd correction p-type transistor 542 logically coupled to the first odd correction input, logically coupled to odd correction inverter circuit 540, and logically coupled to the odd clock output, (i) a second odd pull-up p-type transistor 544 logically coupled to the odd clock input, electrically coupled to the odd voltage supply input, and logically coupled to odd correction p-type transistor 542, (j) an odd correction n-type transistor 546 logically coupled to the second odd correction input, logically coupled to odd correction inverter circuit 540, logically coupled to odd correction p-type transistor 542, and logically coupled to the odd clock output, and (k) a second odd pull-down n-type transistor 548 logically coupled to the odd clock input, electrically coupled to the odd ground input, and logically coupled to odd correction n-type transistor 542.

In an embodiment, odd adjustment inverter circuit 530 is logically configured to receive a clock signal (e.g., clk1) on the odd clock input. In an embodiment, odd adjustment p-type transistor 532 is logically configured to receive the first odd adjustment signal (e.g., NADJ) on the first odd adjustment input. In an embodiment, first odd pull-up p-type transistor 534 is logically configured to receive the clock signal (e.g., clk1) on the odd clock input. In an embodiment, odd adjustment n-type transistor 536 is logically configured to receive the second odd adjustment signal (e.g., PADJ) on the second adjustment input. In an embodiment, first odd pull-down n-type transistor 538 is logically configured to receive the clock signal (e.g., clk1) on the odd adjustment clock input. In an embodiment, odd correction inverter circuit 540 is logically configured to receive the clock signal (e.g., clk1) on the odd clock input. In an embodiment, odd correction p-type transistor 542 is logically configured to receive the first odd correction signal (e.g., NCOR) on the first odd correction input. In an embodiment, second odd pull-up p-type transistor 544 is logically configured to receive the clock signal (e.g., clk1) on the odd adjustment clock input. In an embodiment, odd correction n-type transistor 546 is logically configured to receive the second odd correction signal (e.g., PCOR) on the second odd correction input. In an embodiment, second odd pull-down n-type transistor 548 is logically configured to receive the clock signal (e.g., clk1) on the odd adjustment clock input.

In an embodiment, as depicted in FIG. 5B, the DCC control signals are transmitted as the first odd adjustment signal (e.g., NADJ) and the second odd adjustment signal (e.g., PADJ) and are respectively received on the first odd adjustment input and on the second odd adjustment input of at least one odd adjustment and correction circuit (1 . . . N) 420. Also in an embodiment, as depicted in FIG. 5B, the DCC control signals are converted, by a control circuit 531, into the first odd correction signal (e.g., NCOR) and the second odd correction signal (e.g., PCOR), where the first odd correction signal (e.g., NCOR) and the second odd correction signal (e.g., PCOR) are respectively received on the first odd correction input and on the second odd correction input of at least one odd adjustment and correction circuit (1 . . . N) 420.

Example

For example, with respect to implementation 1 of the present invention as shown in FIG. 3A, Table 1 shows the active transistors for various DCC control values, delivered to implementation 1 in FIG. 3A via the DCC control signals. In Table 1, a value of 1 means the signal is at level VDD (e.g., voltage supply), while a value of 0 means GND (e.g., ground, electrical ground). In an embodiment, as the NADJ & NCOR signals drive PFETs (i.e., p-type transistors), a NADJ/NCOR value of 1 switches a PFET (i.e., p-type transistor) off, while a NADJ/NCOR value of 0 switches the PFET (i.e., p-type transistor) on. In an embodiment, as the PADJ and PCOR signals drive NFETs (i.e., n-type transistors), a PADJ/PCOR value of 1 switches a NFET (i.e., n-type transistor) on, while a PADJ/PCOR value of 0 switches the NFET (i.e., n-type transistor) off.

TABLE 1

Signal settings for duty cycle correction with delay compensation.

| dcc control | NADJ1 | PADJ1 | NADJ2 | PADJ2 | NCOR1 | PCOR1 | NCOR2 | PCOR2 |
|---|---|---|---|---|---|---|---|---|
| 63  | 11...11 | 11...11 | 00...00 | 00...00 | 11...11 | 00...00 | 11...11 | 00...00 |
| 62  | 11...10 | 11...11 | 00...00 | 00...00 | 11...11 | 00...00 | 11...11 | 00...00 |
| 61  | 11...10 | 11...11 | 00...00 | 00...01 | 11...11 | 00...00 | 11...11 | 00...00 |
| 0   | 00...00 | 11...11 | 00...00 | 11...11 | 11...11 | 00...00 | 11...11 | 00...00 |
| −61 | 00...00 | 00...01 | 00...01 | 11...11 | 00...01 | 11...10 | 00...01 | 11...10 |
| −62 | 00...00 | 00...01 | 11...11 | 11...11 | 00...01 | 11...10 | 00...00 | 11...11 |
| −63 | 00...00 | 00...00 | 11...11 | 11...11 | 00...00 | 11...11 | 00...00 | 11...11 |

For example, with respect to implementation 1 of the present invention as shown in FIG. 3A, Table 2 shows the active transistors (i.e., the transistors in a conducting state and driven by the input signals PADJ, NADJ, PCOR, NCOR), for various DCC control values, delivered to implementation 1 in FIG. 3A via the DCC control signals.

TABLE 2

Permutation of blocks for the DCC with delay compensation

| dcc control | ADJUST | CORRECT |
|---|---|---|
| 31   | 32P + 1N + 1P + 1N  | 0 + 1P + 1N |
| 30   | 32P + 2N + 1P + 1N  | 0 + 1P + 1N |
| 0/−0 | 32P + 32N + 1P + 1N | 0 + 1P + 1N |
| −30  | 2P + 32N + 1P + 1N  | 30P + 30N + 1P + 1N |
| −31  | 1P + 32N + 1P + 1N  | 31P + 31N + 1P + 1N |

Figure 6A:
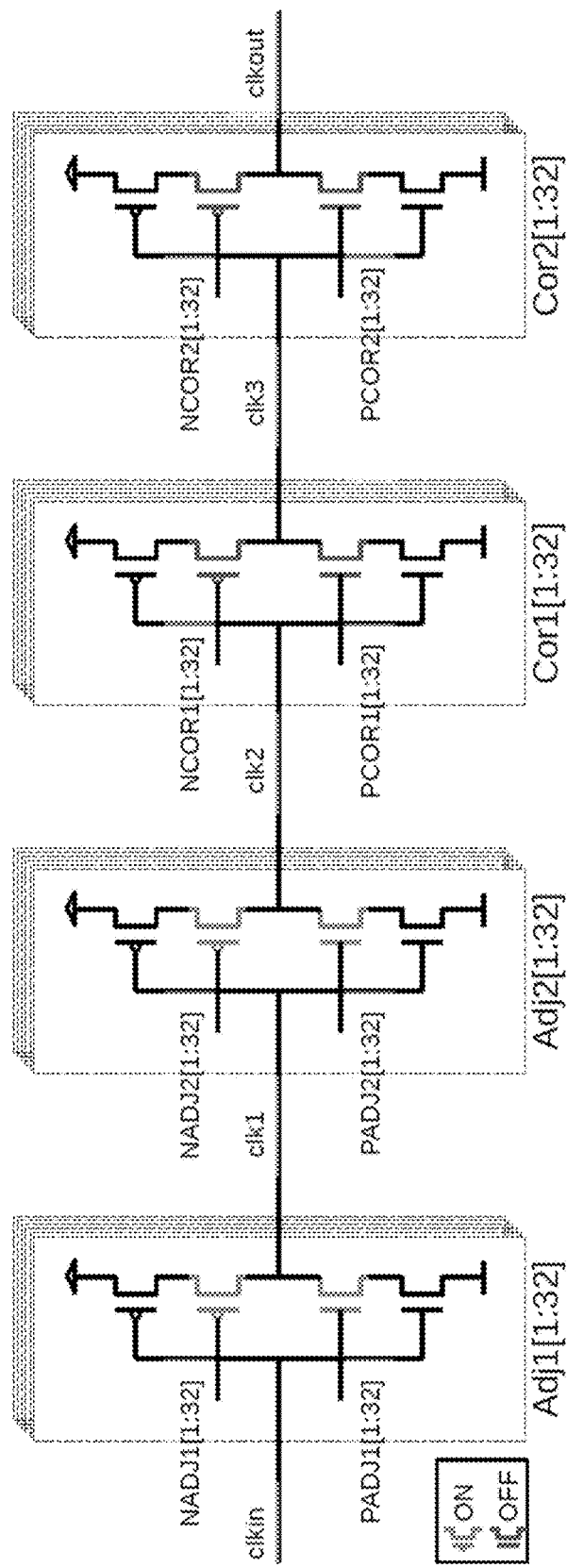
FIG. 6A depicts a circuit diagram in accordance with an embodiment of the present invention.
Figure 6B:
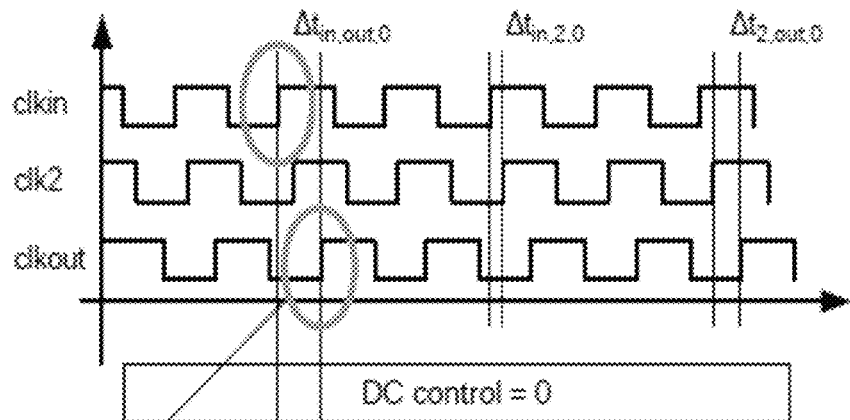
FIG. 6B depicts a graph in accordance with an exemplary embodiment of the present invention.

FIG. 6A, for example, shows the status of the transistors of the present invention for implementation 1 (shown in FIG. 3A) for a DCC control value of zero. With a DCC control value of zero, both clock edges of the input clock signal (clkin) (active clock edge and inactive clock edge) could pass first adjustment circuit 310 (e.g., Adj1) and second adjustment circuit 312 (e.g., Adj2) with minimal delay and impact. In order to align the active edge of the input clock signal to other setting/values of the DCC control, both edges of the input clock signal (clkin) (active clock edge and inactive clock edge) could be delayed when passing through first correction circuit 314 (e.g., Cor1) and first correction circuit 316 (e.g., Cor2). FIG. 6B, for example, depicts clock signals (e.g., clkin, clk2, clkout) corresponding to implementation 1 for a DCC control value of zero.

Figure 6D:
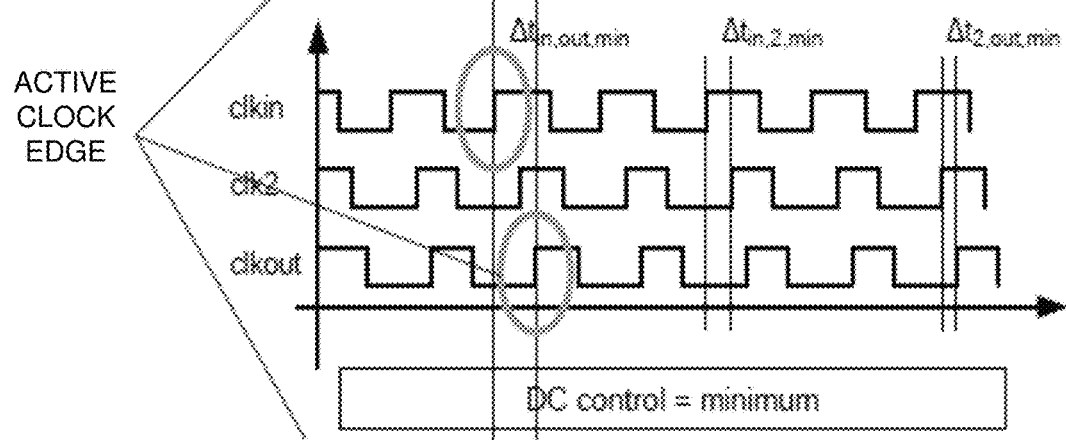
FIG. 6D depicts a graph in accordance with an exemplary embodiment of the present invention.
Figure 6F:
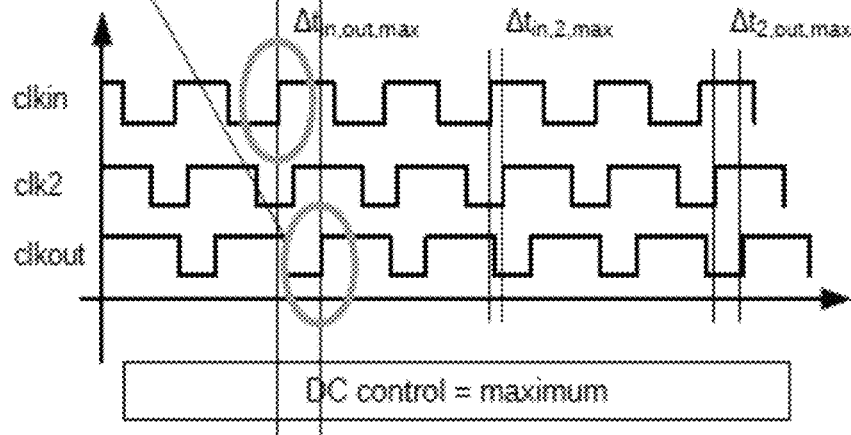
FIG. 6F depicts a graph in accordance with an exemplary embodiment of the present invention.
Figure 6C:
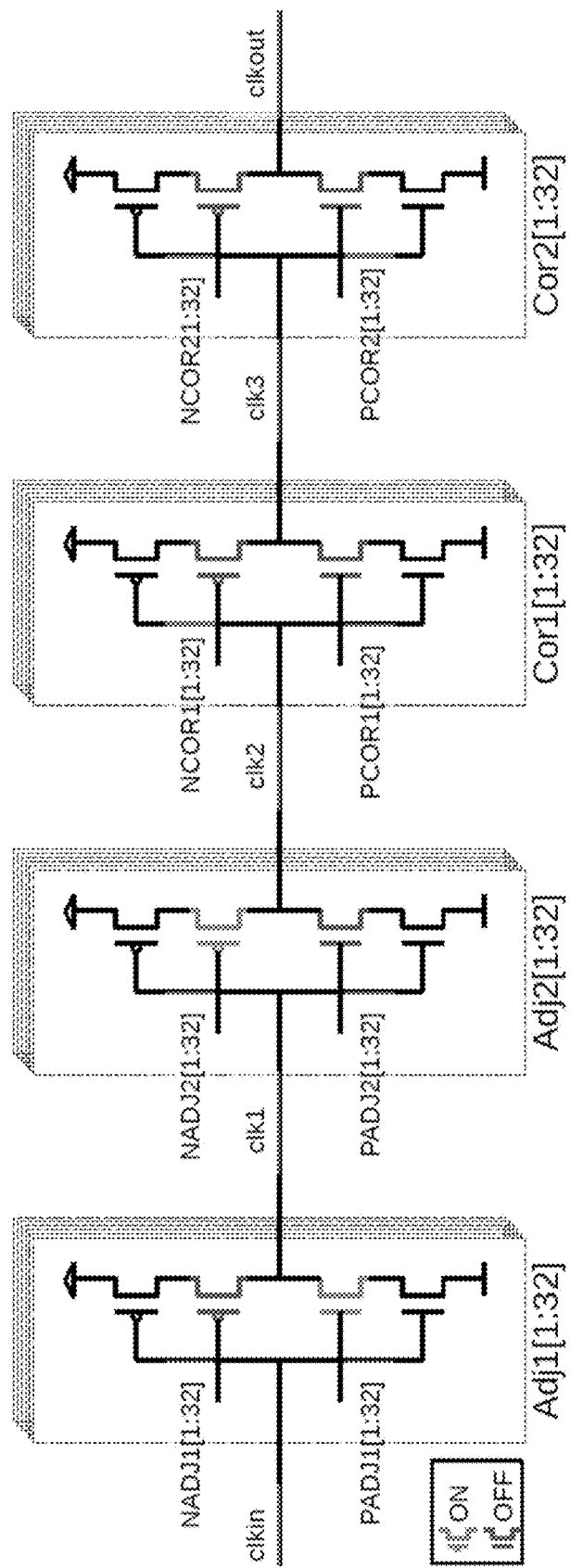
FIG. 6C depicts a circuit diagram in accordance with an embodiment of the present invention.

FIG. 6C, for example, shows the status of the transistors of the present invention for implementation 1 (shown in FIG. 3A) for a positive DCC control value. With a positive DCC control value, only the inactive clock edge of the input clock signal (clkin) could be delayed by first adjustment circuit 310 (e.g., Adj1) and second adjustment circuit 312 (e.g., Adj2) (thus a subset of the n-type transistors in first adjustment circuit 310 (e.g., Adj1) and the p-type transistors in second adjustment circuit 312 (e.g., Adj2) should be deactivated). In order to align the active edge of the input clock signal to negative values of the DCC control, both edges of the input clock signal (clkin) (active clock edge and inactive clock edge) could be delayed when passing through first correction circuit 314 (e.g., Cor1) and first correction circuit 316 (e.g., Cor2). FIG. 6D, for example, depicts clock signals (e.g., clkin, clk2, clkout) corresponding to implementation 1 for a maximal DCC control value where all the n-type transistors in first adjustment circuit 310 (e.g., Adj1) and all the p-type transistors in second adjustment circuit 312 (e.g., Adj2) are deactivated).

Figure 6E:
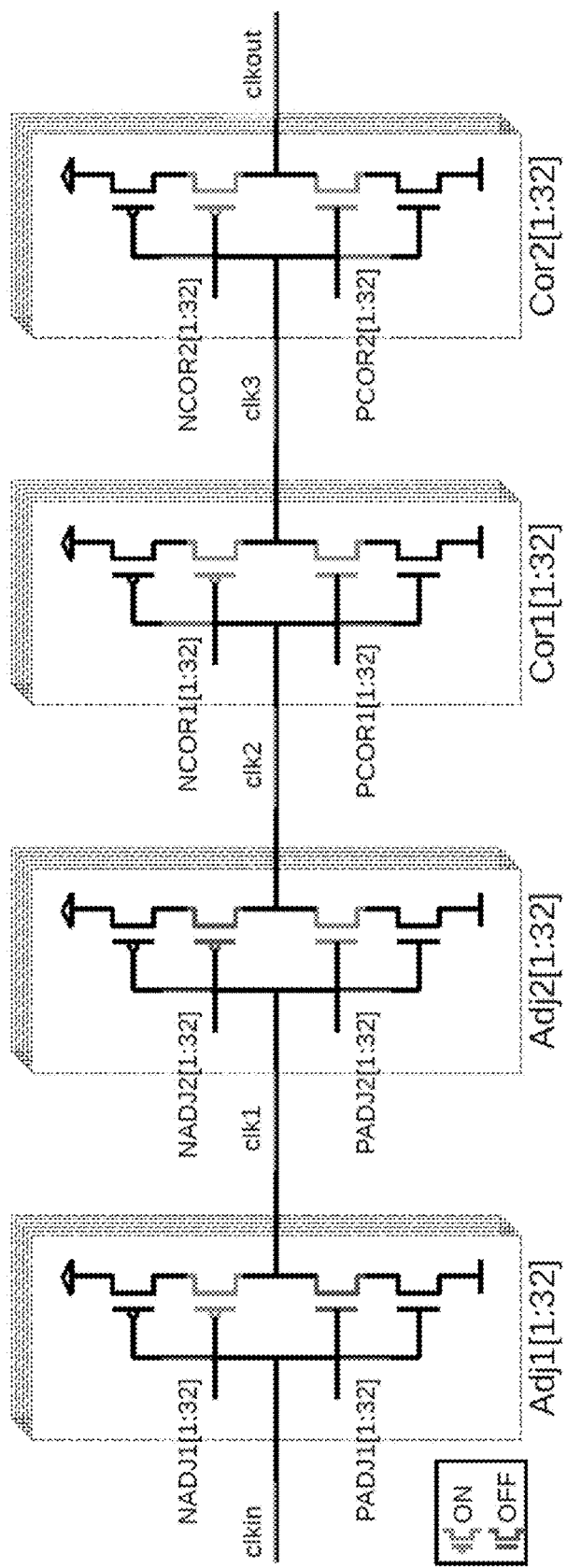
FIG. 6E depicts a circuit diagram in accordance with an embodiment of the present invention.

FIG. 6E, for example, shows the status of the transistors of the present invention for implementation 1 (shown in FIG. 3A) for a negative DCC control value. With a negative DCC control value, the active clock edge of the input clock signal (clkin) could be delayed by first adjustment circuit 310 (e.g., Adj1) and second adjustment circuit 312 (e.g., Adj2) (thus a subset of the p-type transistors in first adjustment circuit 310 (e.g., Adj1) and the n-type transistors in second adjustment circuit 312 (e.g., Adj2) are deactivated). With a negative DCC control value, first correction circuit 314 (e.g., Cor1) and first correction circuit 316 (e.g., Cor2) would introduce less further delay into the input clock signal than for a positive DCC control value. FIG. 6F, for example, depicts clock signals (e.g., clkin, clk2, clkout) corresponding to implementation 1 for a minimal DCC control value.

Figure 7A:
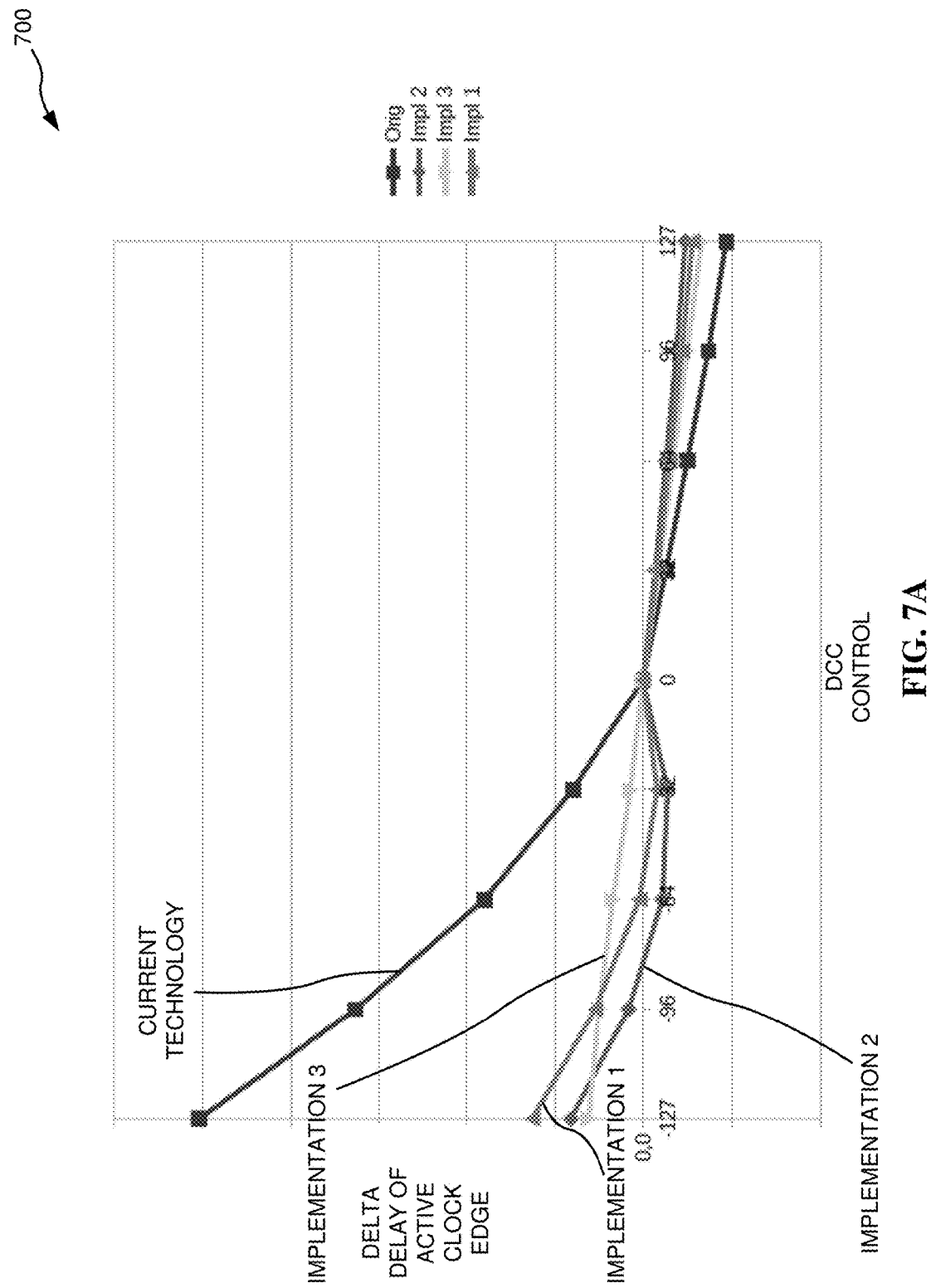
FIG. 7A depicts a graph in accordance with an exemplary embodiment of the present invention.

FIG. 7A depicts, for example, a graph 700 indicating the results of testing a current technology DCC and testing implementation 1, implementation 2, and implementation 3 of the current invention, namely showing delta delay of the active clock edge on the y-axis/vertical axis and DCC control on the x-axis/horizontal axis. In a specific example, graph 700 depicts that the delta delay/shifting of the active clock edge could be reduced by at least implementation 1, implementation 2, and implementation 3 of the present invention. The present invention could be implemented in the similar silicon area a current technology DCCs. The present invention could also be plug-in compatible for a given interface to a controlling monitor.

Figure 7B:
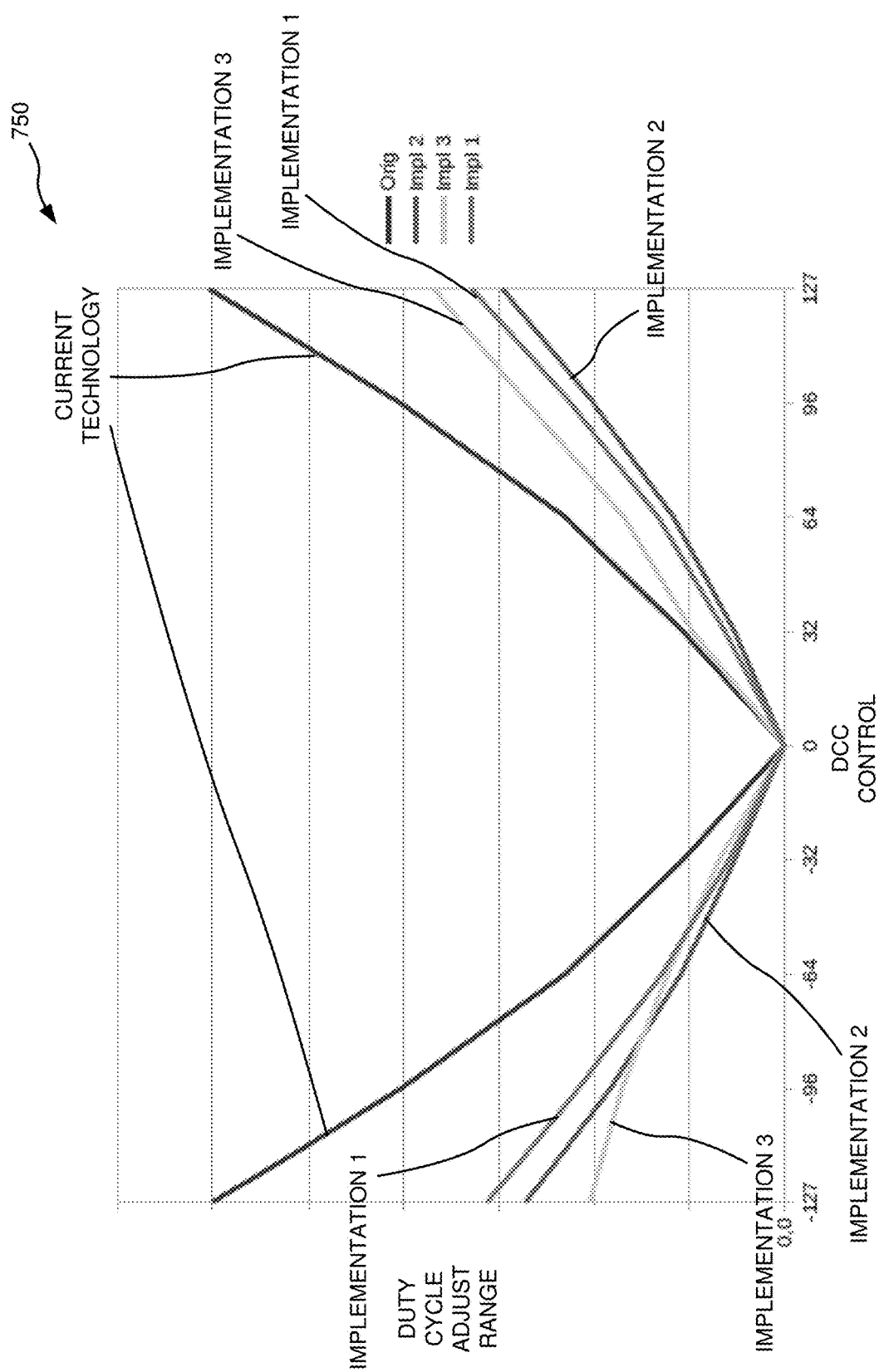
FIG. 7B depicts a graph in accordance with an exemplary embodiment of the present invention.

FIG. 7B depicts, for example, a graph 750 indicating the results of testing a current technology DCC and testing implementation 1, implementation 2, and implementation 3 of the current invention, namely showing duty cycle adjust range on the y-axis/vertical axis and DCC control on the x-axis/horizontal axis. In a specific example, graph 750 depicts that the duty cycle adjust range/duty cycle correction range could be reduced by at least implementation 1, implementation 2, and implementation 3 of the present invention. In a particular example, graph 750 depicts that the duty cycle adjust range/duty cycle correction range could be reduced by the present invention by at least a factor of two.

Alternative Implementations

FIG. 8A, FIG. 8B, FIG. 8C, FIG. 8D, FIG. 8E, and FIG. 8F depict alternative embodiments of implementation 1, implementation, 2, implementation 4, implementation 5, implementation 6, and implementation 7, respectively, where the active clock edge of the input clock signal is a falling edge of the input clock signal.

Figure 8A:
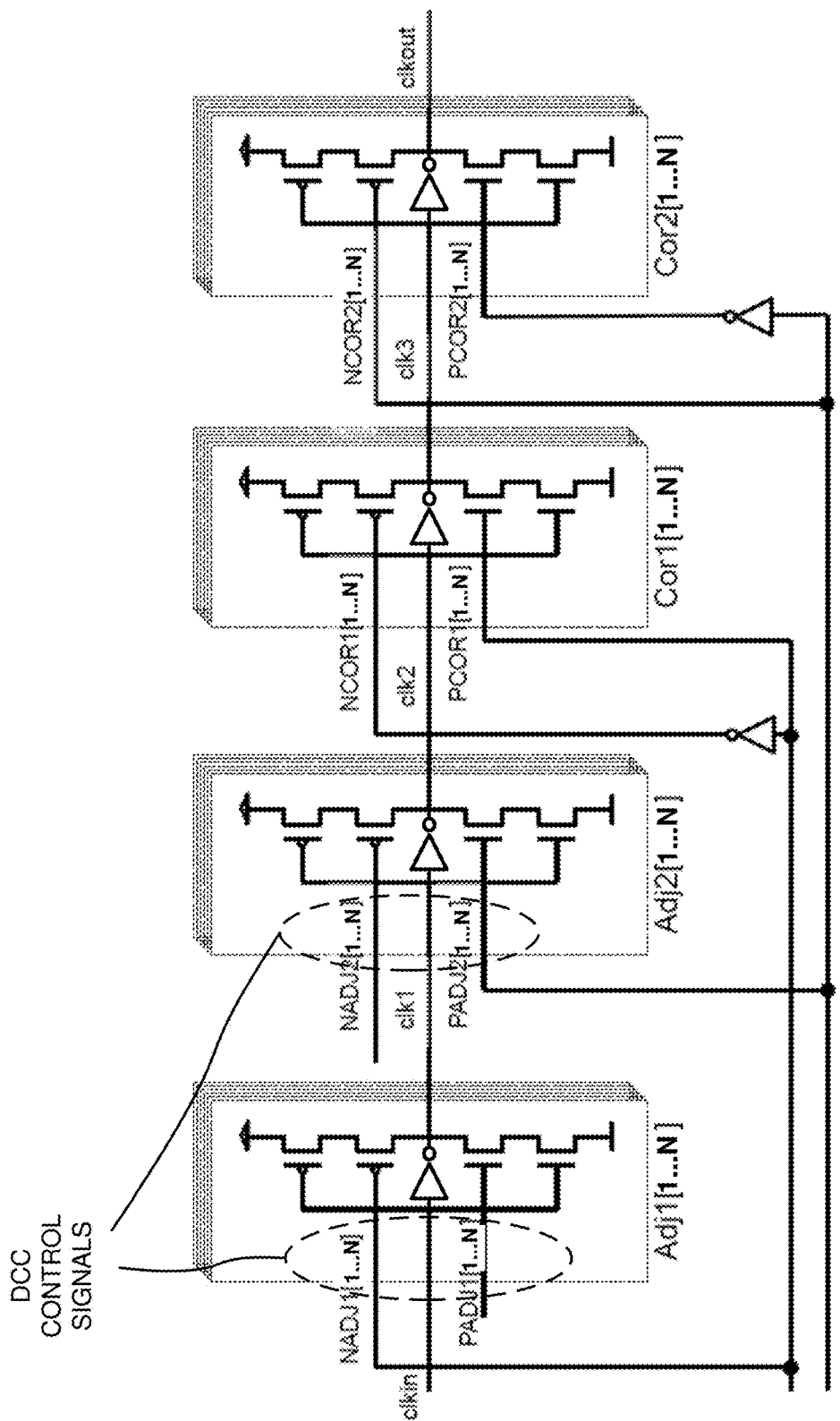
FIG. 8A depicts a circuit diagram in accordance with an embodiment of the present invention.

In an alternative embodiment, as depicted in FIG. 8A, the DCC control signals are converted, by circuitry implementing Equation 3A, into first correction signals 1 . . . N (e.g., NCOR1, NCOR2 and second correction signals 1 . . . N (e.g., PCOR1, PCOR2).

$$NCOR1 = \text{not}(NADJ1) \quad \text{Equation 3A}$$
$$PCOR1 = NADJ1$$
$$NCOR2 = PADJ2$$
$$PCOR2 = \text{not}(PADJ2)$$

Figure 8B:
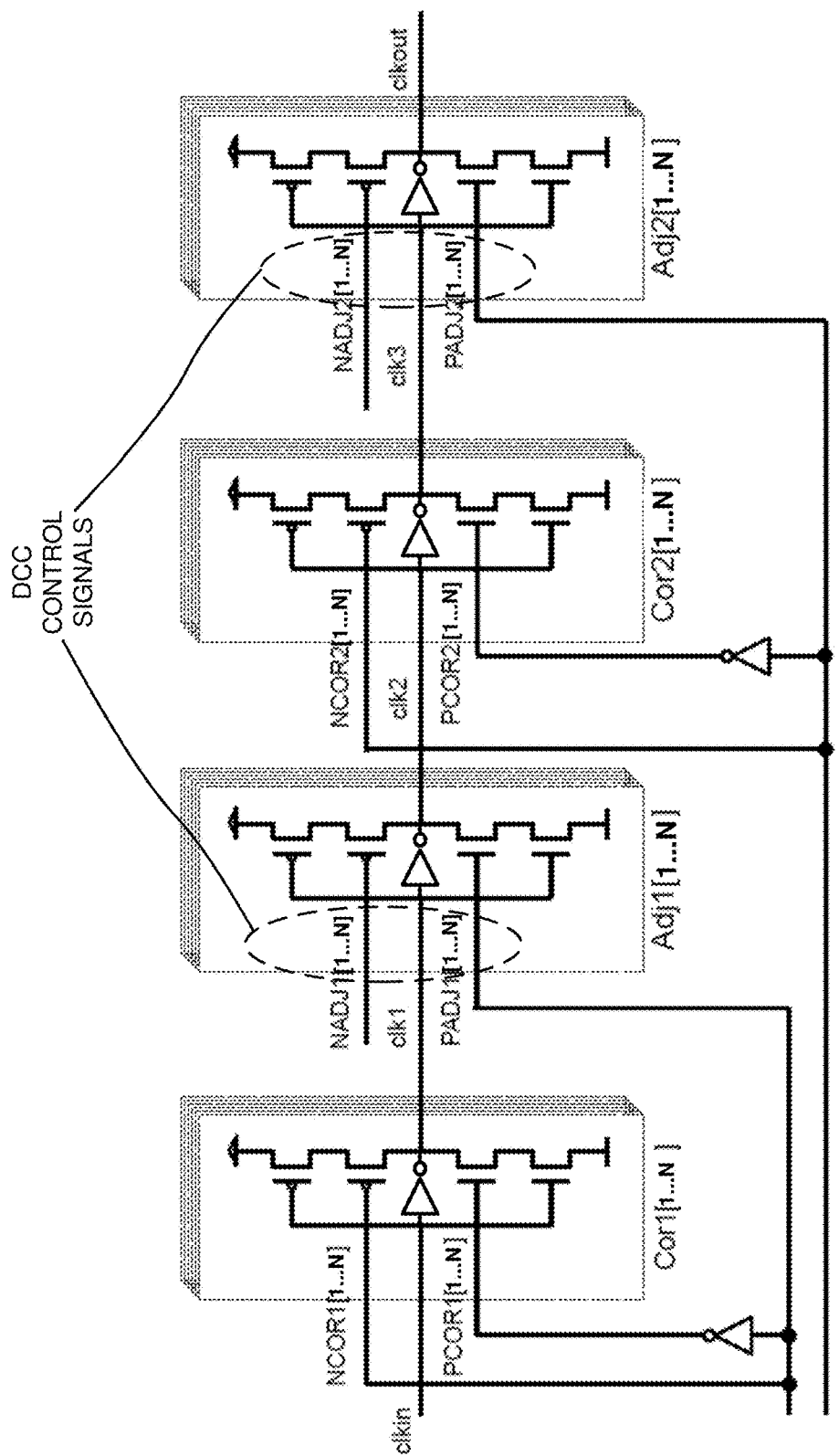
FIG. 8B depicts a circuit diagram in accordance with an embodiment of the present invention.

In an alternative embodiment, as depicted in FIG. 8B, the DCC control signals are converted, by circuitry implementing Equation 3B, into first correction signals 1 . . . N (e.g., NCOR1, NCOR2 and second correction signals 1 . . . N (e.g., PCOR1, PCOR2).

$$NCOR1 = PADJ1 \quad \text{Equation 3B}$$
$$PCOR1 = \text{not}(PADJ1)$$
$$NCOR2 = PADJ2$$
$$PCOR2 = \text{not}(PADJ2)$$

Figure 8C:
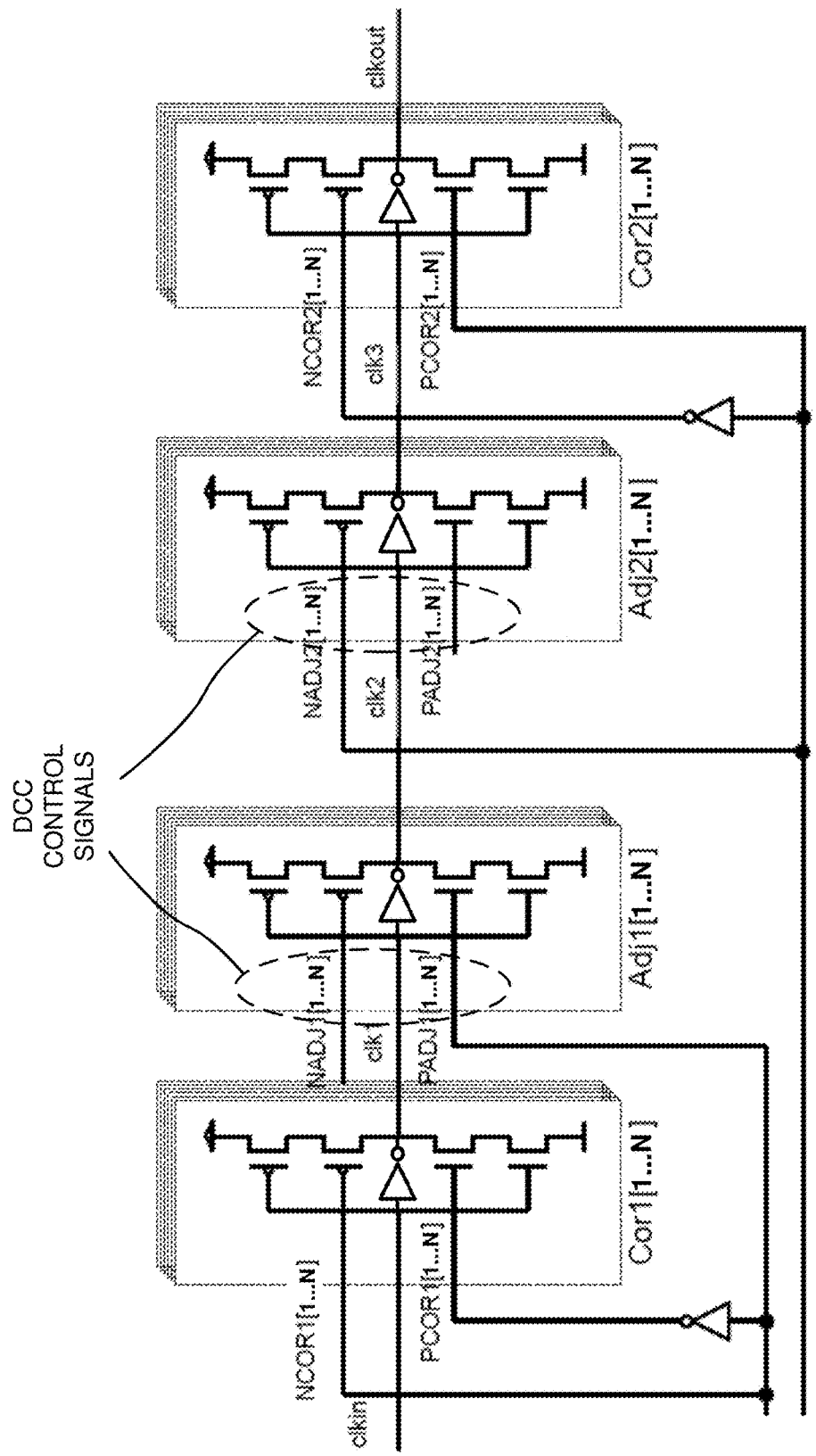
FIG. 8C depicts a circuit diagram in accordance with an embodiment of the present invention.

In an alternative embodiment, as depicted in FIG. 8C, the DCC control signals are converted, by circuitry implementing Equation 3C, into first correction signals 1 . . . N (e.g., NCOR1, NCOR2 and second correction signals 1 . . . N (e.g., PCOR1, PCOR2).

$$NCOR1 = PADJ1 \quad \text{Equation 3C}$$
$$PCOR1 = \text{not}(PADJ1)$$
$$NCOR2 = \text{not}(NADJ2)$$
$$PCOR2 = NADJ2$$

Figure 8D:
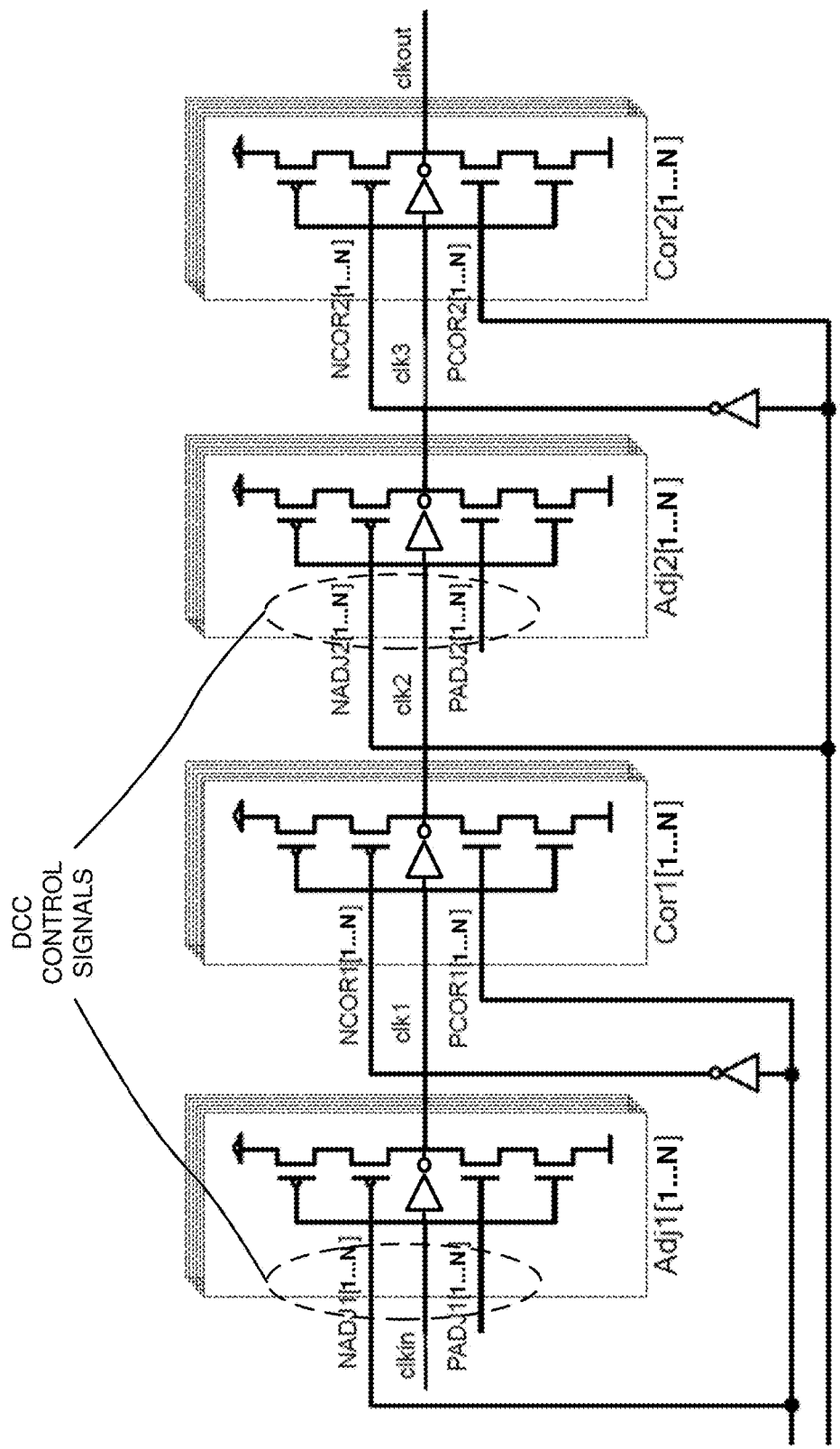
FIG. 8D depicts a circuit diagram in accordance with an embodiment of the present invention.

In an alternative embodiment, as depicted in FIG. 8D, the DCC control signals are converted, by circuitry implementing Equation 3D, into first correction signals 1 . . . N (e.g., NCOR1, NCOR2 and second correction signals 1 . . . N (e.g., PCOR1, PCOR2).

$$NCOR1 = \text{not}(NADJ1) \quad \text{Equation 3D}$$
$$PCOR1 = NADJ1$$
$$NCOR2 = \text{not}(NADJ2)$$
$$PCOR2 = NADJ2$$

Figure 8E:
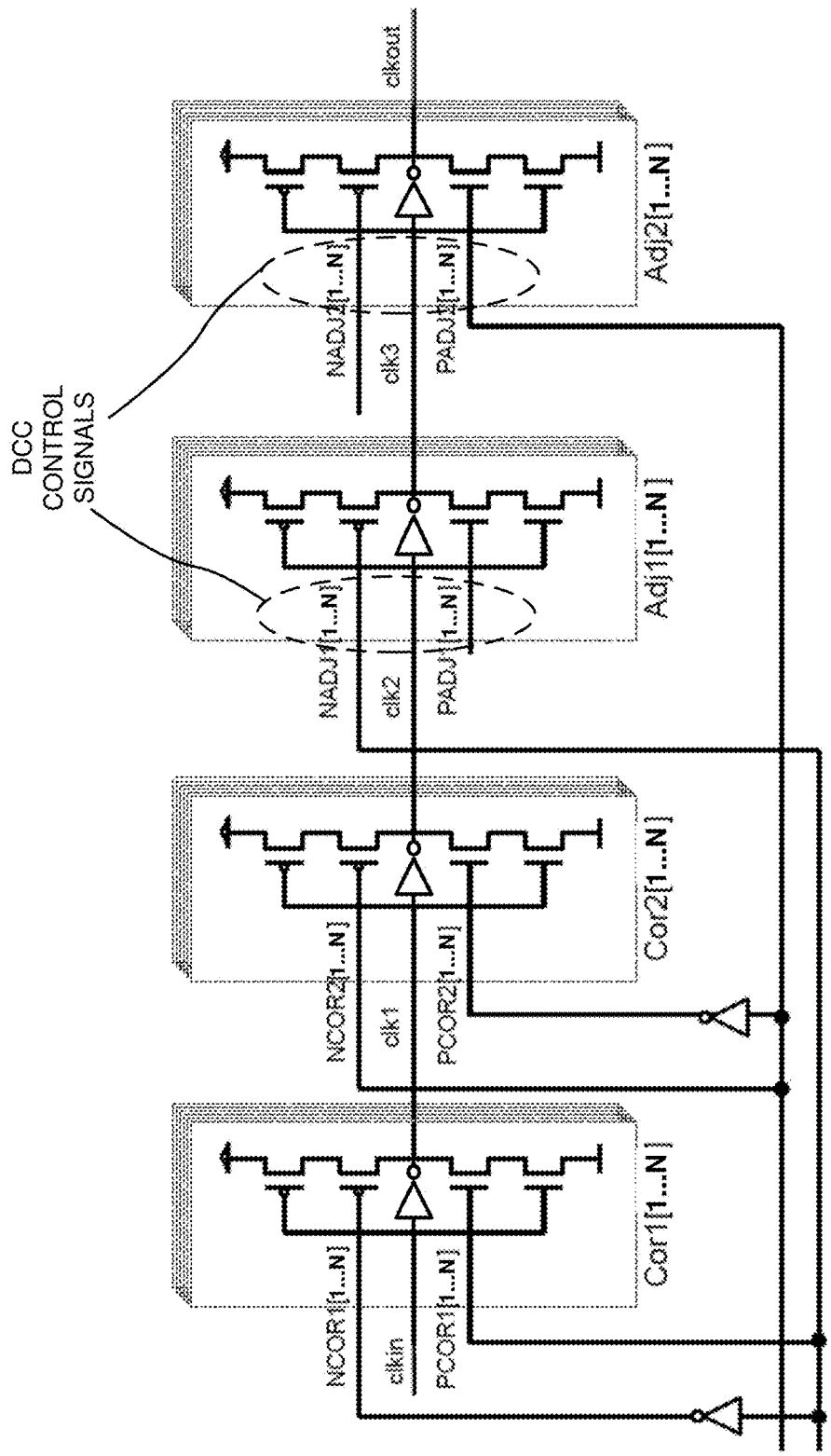
FIG. 8E depicts a circuit diagram in accordance with an embodiment of the present invention.

In an alternative embodiment, as depicted in FIG. 8E, the DCC control signals are converted, by circuitry implementing Equation 3E, into first correction signals 1 . . . N (e.g., NCOR1, NCOR2 and second correction signals 1 . . . N (e.g., PCOR1, PCOR2).

$$NCOR1 = \text{not}(NADJ1) \quad \text{Equation 3E}$$
$$PCOR1 = NADJ1$$
$$NCOR2 = PADJ2$$
$$PCOR2 = \text{not}(PADJ2)$$

Figure 8F:
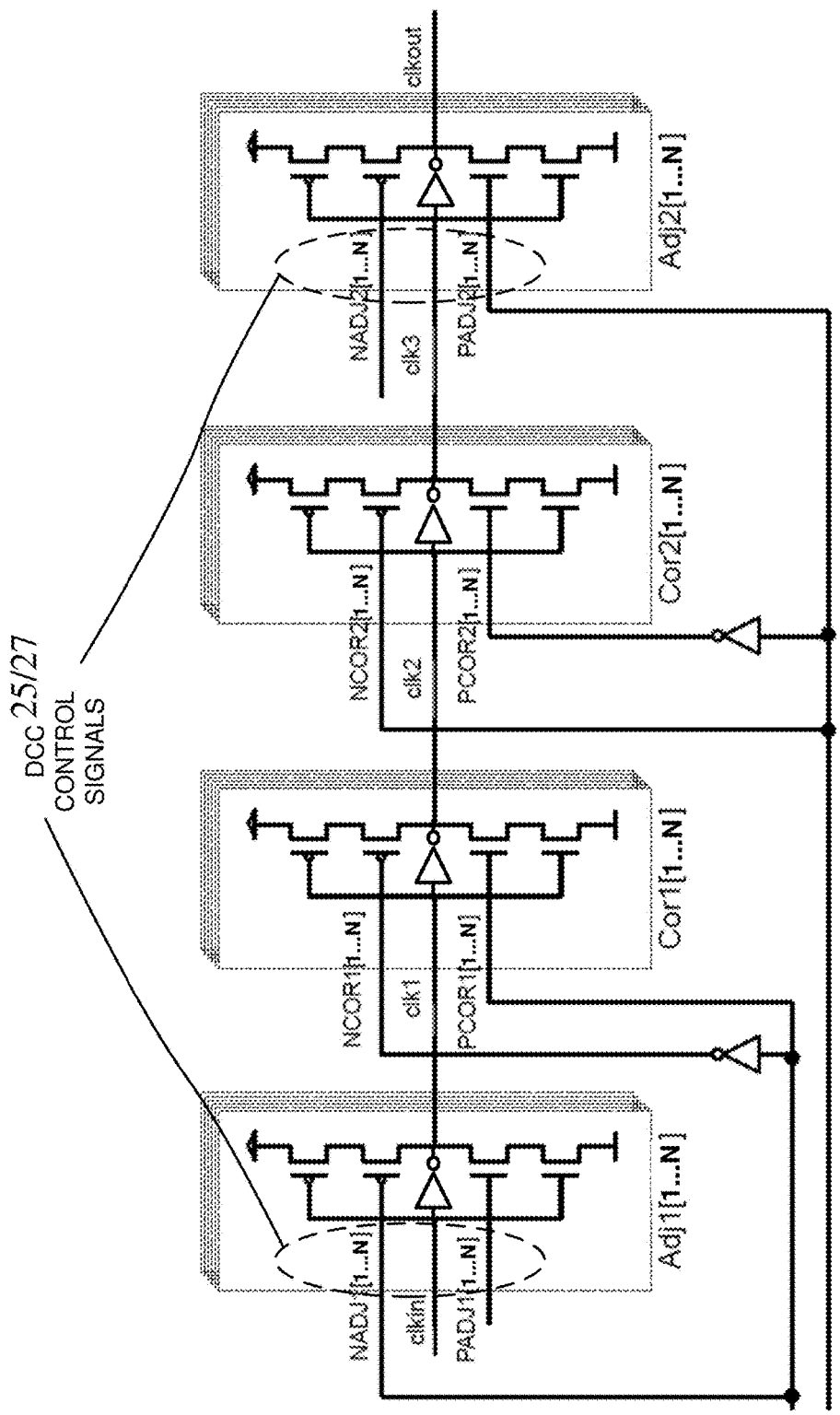
FIG. 8F depicts a circuit diagram in accordance with an embodiment of the present invention.

In an alternative embodiment, as depicted in FIG. 8F, the DCC control signals are converted, by circuitry implementing Equation 3F, into first correction signals 1 . . . N (e.g., NCOR1, NCOR2 and second correction signals 1 . . . N (e.g., PCOR1, PCOR2).

$$NCOR1 = \text{not}(NADJ1) \quad \text{Equation 3F}$$
$$PCOR1 = NADJ1$$
$$NCOR2 = PADJ2$$
$$PCOR2 = \text{not}(PADJ2)$$

Figure 9A:
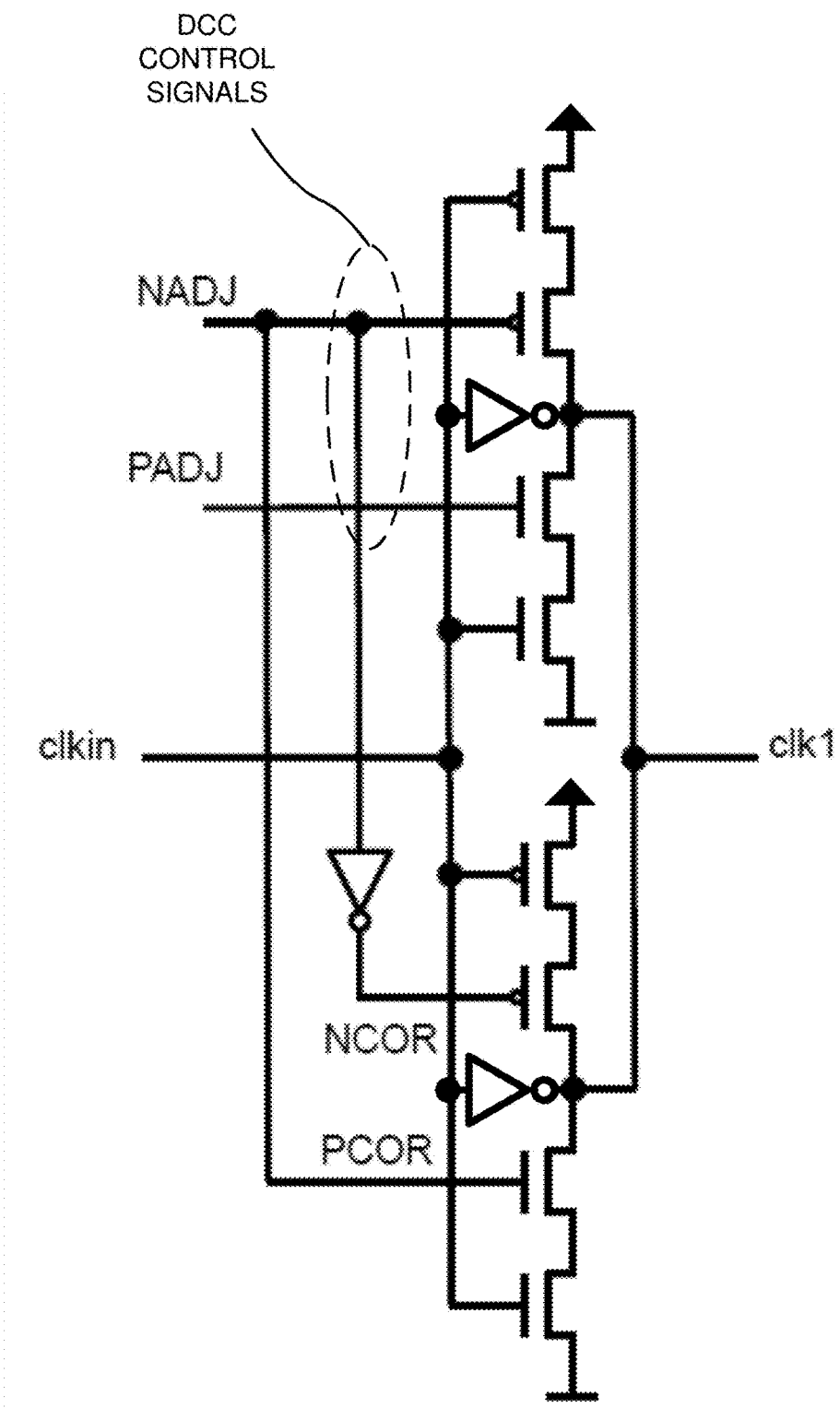
FIG. 9A depicts a circuit diagram in accordance with an embodiment of the present invention.
Figure 9B:
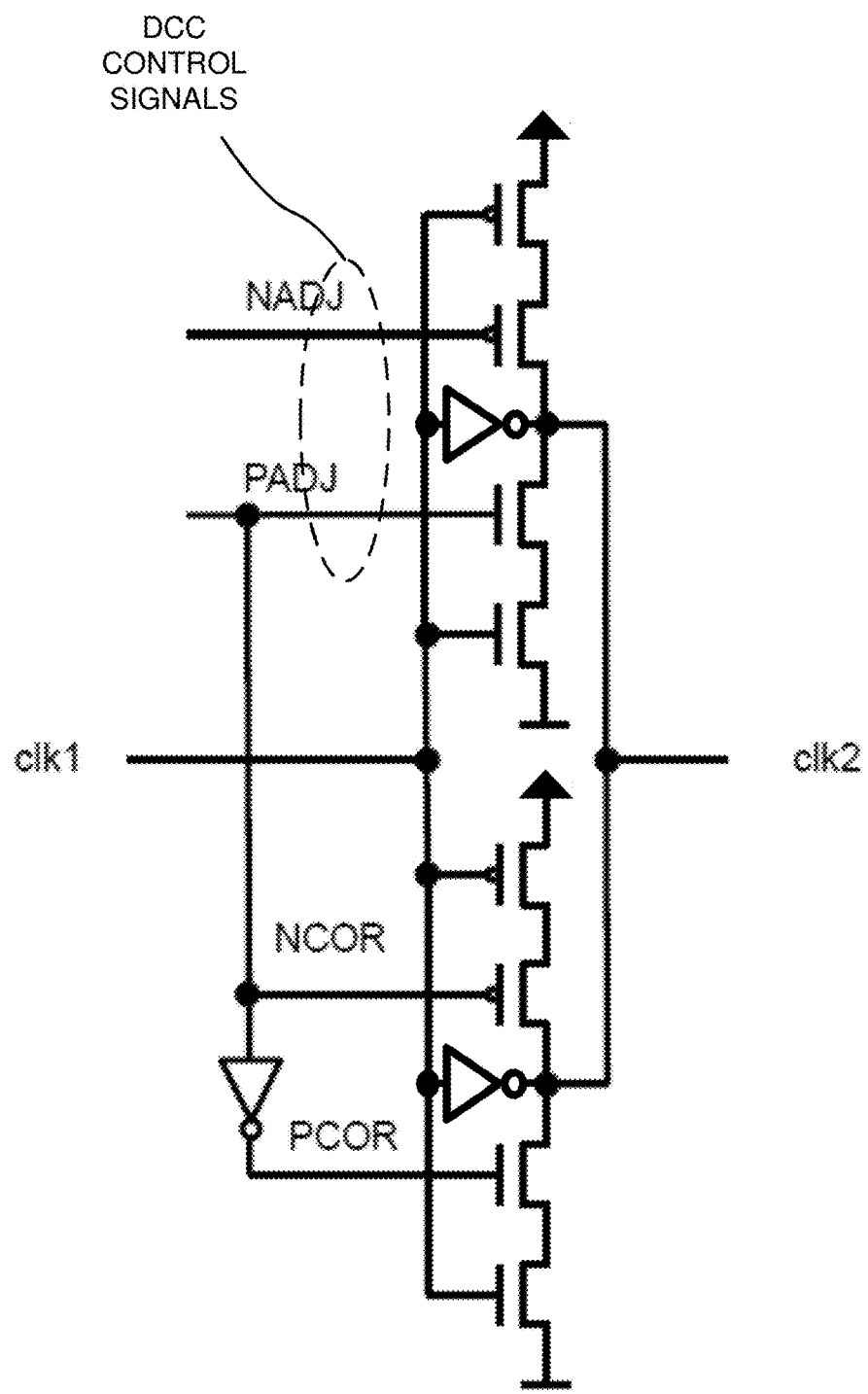
FIG. 9B depicts a circuit diagram in accordance with an embodiment of the present invention.

FIG. 9A and FIG. 9B depict an alternative embodiment of implementation 3, where the active clock edge of the input clock signal is a falling edge of the input clock signal. As depicted in FIG. 9A, in an alternative embodiment, the DCC control signals are transmitted as the first even adjustment signal (e.g., NADJ) and the second even adjustment signal (e.g., PADJ) and are respectively received on the first even adjustment input and on the second even adjustment input of at least one even adjustment and correction circuit. Also in an embodiment, as depicted in FIG. 9A, the DCC control signals are converted, by circuitry implementing Equation 4A, into the first even correction signal (e.g., NCOR) and the second even correction signal (e.g., PCOR).

$$NCOR = \text{not}(NADJ) \quad \text{Equation 4A}$$
$$PCOR = NADJ$$

As depicted in FIG. 9B, in an alternative embodiment, the DCC control signals are transmitted as the first odd adjustment signal (e.g., NADJ) and the second odd adjustment signal (e.g., PADJ) and are respectively received on the first odd adjustment input and on the second odd adjustment input of at least odd even adjustment and correction circuit. Also in an embodiment, as depicted in FIG. 9B, the DCC control signals are converted, by circuitry implementing Equation 4B, into the first odd correction signal (e.g., NCOR) and the second odd correction signal (e.g., PCOR).

$$PCOR = \text{not}(PADJ) \quad \text{Equation 4B}$$
$$NCOR = PADJ$$

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
receiving an input clock signal by one of a set of at least one adjustment circuit and at least one correction circuit, wherein the at least one correction circuit is logically coupled to the at least one adjustment circuit;
in response to receiving duty cycle correction control signals by at least one control circuit logically coupled to the at least one adjustment circuit and logically coupled to the at least one correction circuit, outputting at least one first adjustment signal, at least one second adjustment signal, at least one first correction signal, and at least one second correction signal, by the at least one control circuit;
in response to the at least one adjustment circuit receiving the at least one first adjustment signal on a first adjustment input of the at least one adjustment circuit and the at least one second adjustment signal on a second adjustment input of the at least one adjustment circuit, changing by the at least one adjustment circuit a duty cycle value of the input clock signal;
in response to the at least one correction circuit receiving the at least one first correction signal on a first correction input of the at least one correction circuit and the at least one second correction signal on a second correction input of the at least one correction circuit, compensating by the at least one correction circuit for a shift of an active clock edge of the input clock signal; and
in response to the at least one adjustment circuit receiving the at least one first adjustment signal and the at least one second adjustment signal and in response to the at least one correction circuit receiving the at least one first correction signal and the at least one second correction signal, transmitting a corrected output clock signal by one of the set of the at least one adjustment circuit and the at least one correction circuit.

2. The method of claim 1 further comprising in response to receiving a duty cycle control value of zero as delivered by the duty cycle correction control signals via the at least one control circuit, adding, by the at least one correction circuit, a correction delay to the active clock edge of the input clock signal and to an inactive clock edge of the input clock signal.

3. The method of claim 1 further comprising in response to receiving a positive duty cycle control value as delivered by the duty cycle correction control signals via the at least one control circuit,
adding, by the at least one adjustment circuit, an adjustment delay to an inactive clock edge of the input clock signal, and
adding, by the at least one correction circuit, a correction delay to the active clock edge of the input clock signal and to the inactive clock edge of the input clock signal.

4. The method of claim 1 further comprising in response to receiving a negative duty cycle control value as delivered by the duty cycle correction control signals via the at least one control circuit, adding, by the at least one adjustment circuit, an adjustment delay to the active clock edge of the input clock signal.

* * * * *